US009417473B2

(12) United States Patent
Ozeki et al.

(10) Patent No.: US 9,417,473 B2
(45) Date of Patent: Aug. 16, 2016

(54) DISPLAY DEVICE WITH A FRAME HOLDING A DRIVE BOARD AND TELEVISION DEVICE HAVING THE DISPLAY DEVICE

(71) Applicant: Sharp Kabushiki Kaisha, Osaka-shi, Osaka (JP)

(72) Inventors: Tsuyoshi Ozeki, Osaka (JP); Motomitsu Itoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 79 days.

(21) Appl. No.: 14/374,937

(22) PCT Filed: Jan. 30, 2013

(86) PCT No.: PCT/JP2013/051971
§ 371 (c)(1),
(2) Date: Jul. 28, 2014

(87) PCT Pub. No.: WO2013/118616
PCT Pub. Date: Aug. 15, 2013

(65) Prior Publication Data
US 2014/0375899 A1 Dec. 25, 2014

(30) Foreign Application Priority Data
Feb. 6, 2012 (JP) ................................. 2012-022969

(51) Int. Cl.
*H04N 5/64* (2006.01)
*G02F 1/1333* (2006.01)
(Continued)

(52) U.S. Cl.
CPC .......... *G02F 1/133308* (2013.01); *G02B 6/009* (2013.01); *G02F 1/13306* (2013.01);
(Continued)

(58) Field of Classification Search
CPC ............. H04N 5/70; H04N 5/64; H04N 9/12; H04N 3/14; G02F 2001/133317; G02F 1/133308; G09F 9/35
USPC ......................................................... 348/791
See application file for complete search history.

(56) References Cited

U.S. PATENT DOCUMENTS
6,801,195 B2 10/2004 Yoshida
7,692,732 B2 4/2010 Tsubokura et al.
(Continued)

FOREIGN PATENT DOCUMENTS
CN 201035274 Y 3/2008
CN 102265085 A 11/2011
(Continued)

OTHER PUBLICATIONS
Official Communication issued in International Patent Application No. PCT/JP2013/051971, mailed on May 7, 2013.

*Primary Examiner* — Michael Lee
(74) *Attorney, Agent, or Firm* — Keating & Bennett, LLP

(57) ABSTRACT

A display device 10 according to this invention includes a display panel 11, a drive board 113, a flexible wiring 111, and a frame 13. The display panel 11 is configured to display an image on a front side. The drive board 113 is configured to control display driving of the display panel 11. The flexible wiring 111 having flexibility connects the display panel 11 and the drive board 113 electrically. The frame 13 includes a frame portion 13a, a sidewall 13b, and a housing portion 13c. The frame portion 13a has a frame-like shape that is opposite a peripheral area of the front side of the display panel 11. The sidewall 13b extends from the frame portion 13a toward a rear side of the display panel 11 and surrounds the display panel 11. The housing portion 13c is located inside the sidewall 13b and includes the groove 13c1 that opens to the frame portion 13a. The housing portion 13c holds the drive board 113 fitted in the groove 13c1.

15 Claims, 10 Drawing Sheets

(51) Int. Cl.
  *G02F 1/133* (2006.01)
  *H04N 9/30* (2006.01)
  *G02F 1/1335* (2006.01)
  *H01L 23/498* (2006.01)
  *F21V 8/00* (2006.01)

(52) U.S. Cl.
  CPC ............ *G02F1/133524* (2013.01); *H04N 9/30* (2013.01); *G02B 6/0083* (2013.01); *G02B 6/0085* (2013.01); *G02F 1/133615* (2013.01); *G02F 2001/13332* (2013.01); *H01L 23/4985* (2013.01); *H01L 2924/0002* (2013.01); *H04N 5/64* (2013.01)

(56) References Cited

U.S. PATENT DOCUMENTS

| | | | |
|---|---|---|---|
| 8,054,400 B2 | 11/2011 | Tsubokura et al. | |
| 8,233,110 B2 | 7/2012 | Suzuki | |
| 8,681,284 B2 * | 3/2014 | Kim | G02F 1/133308 349/150 |
| 2002/0126248 A1 | 9/2002 | Yoshida | |
| 2002/0140651 A1 * | 10/2002 | Lim | G02F 1/13452 345/87 |
| 2007/0188675 A1 | 8/2007 | Tsubokura et al. | |
| 2008/0100769 A1 * | 5/2008 | Hsiao | G02F 1/133308 349/58 |
| 2008/0106670 A1 * | 5/2008 | Chang | G02B 6/0088 349/58 |
| 2008/0186430 A1 * | 8/2008 | Seo | G02B 6/0088 349/65 |
| 2010/0149455 A1 | 6/2010 | Tsubokura et al. | |
| 2010/0188598 A1 | 7/2010 | Suzuki | |
| 2011/0261284 A1 * | 10/2011 | Hong | G02F 1/133308 349/58 |
| 2011/0273631 A1 | 11/2011 | Hayashi | |

FOREIGN PATENT DOCUMENTS

| | | |
|---|---|---|
| JP | 2002-268037 A | 9/2002 |
| JP | 2007-003693 A | 1/2007 |
| JP | 2007-212652 A | 8/2007 |
| JP | 2010-175704 A | 8/2010 |
| JP | 2010-243519 A | 10/2010 |

* cited by examiner

DISPLAY DEVICE WITH A FRAME HOLDING A DRIVE BOARD AND TELEVISION DEVICE HAVING THE DISPLAY DEVICE

TECHNICAL FIELD

This invention relates to a display device and a television device.

BACKGROUND ART

A liquid crystal panel is used for a display device such as a television device, a mobile phone, and a handheld terminal. The liquid crystal panel includes a pair of glass substrates that are opposite to each other with a liquid crystal layer in between. The glass substrates include predetermined electrodes. A driving voltage is applied across the electrodes, and thereby alignment of liquid crystal molecules in the liquid crystal layer is adjusted. The driving voltage is adjusted by a certain drive circuit.

A display device including the liquid crystal panel includes a lighting device (or a backlight device) which provides light to the liquid crystal panel. The lighting device is arranged on a back side of the liquid crystal panel and configured to emit planar light toward a back surface of the liquid crystal panel. As described above, the alignment of the liquid crystal molecules is adjusted. As a result, a percentage of light that passes through the liquid crystal panel in a direction from the back side to a display surface is adjusted, and a display image on the liquid crystal panel is operated.

As disclosed in Patent Document 1, a flexible board on which a drive circuit component (e.g. a gate driver IC) is mounted is disposed on an end portion of the liquid crystal panel. A chassis (a frame member) having a frame-like shape is disposed along a periphery of the liquid crystal panel, and the flexible board that is bent is arranged in the chassis.

With a recent increase in size of a display device, ta configuration including a gate board as apart of drive circuits may be used in some display devices. The gate board including a printed circuit board is connected to an end portion of a flexible board on which drive circuit components are mounted. A drive board such as the gate board is arranged inside the above-mentioned frame-like chassis (a frame member). The drive board may be arranged in the chassis together with a special attachment jig that holds the drive board.

RELATED ART DOCUMENT

Patent Document

Patent Document 1: Japanese Unexamined Patent Application Publication No. 2007-3693

Problem to be Solved by the Invention

Because of an increase in demand for a reduction in size of a frame of a display device in recent years, it is difficult to allocate a space for holding the drive board in the frame-like casing of the display device.

DISCLOSURE OF THE PRESENT INVENTION

An object of this invention is to provide a display device that can house a drive board without affecting a reduction in size of a frame.

Means for Solving the Problem

A display device according to this invention includes a display panel, a drive board, a flexible wiring, a frame. The display panel is configured to display an image on a front side thereof. The drive board is configured to control display driving of the display panel. The flexible wiring establishes electrical connection between the display panel and the drive board. The flexible wiring has flexibility. The frame includes a frame portion, a sidewall, and housing portion. The frame portion has a frame-like shape and is arranged opposite a peripheral area of the front side of the display panel. The sidewall extends from the frame portion toward a rear side of the display panel and surrounds the display panel. The housing portion is located inside the sidewall and includes a groove that opens to the frame portion. The housing portion holds the drive board that is fitted in the groove. In the display device, only by inserting the drive board into the groove, the drive board can be arranged on the rear side of the display panel and can be held in the housing portion. With this configuration, the display device can house the drive board without affecting a reduction in size of the frame of the display device.

In the display device, the housing portion may further include a receiving portion and an inside wall portion. The receiving portion may extend from the sidewall toward the display panel. The inside wall portion may extend from the receiving portion toward the frame portion with a predetermined space away from the sidewall. The groove is defined by the sidewall, the receiving portion, and the inside wall portion.

In the display device, the housing portion may hold the drive board in a standing position with respect to the display panel. The housing portion may hold the drive board in a standing position with respect to the display panel. With this configuration in which the housing portion holds the drive board in a standing position with respect to the liquid crystal panel 11, the groove of the housing portion can be smaller in size. Accordingly, the frame portion (the frame) can be smaller in width.

In the display device, the inside wall portion may include a void at an extended end portion thereof on a frame portion side. The void may be a cutout formed at a part of the extended end portion and through which a part of the drive board held in the housing portion is visible. During disassembly of the liquid crystal display device, the drive board in the housing portion may be removed from the housing portion. If the inside wall portion includes the void, a worker can touch the drive board through the void. Therefore, the drive board may be easily removed from the housing portion.

In the display device, the housing portion may continue from the sidewall. With this configuration in which the housing portion continues from the sidewall, the number of parts or the number of assembly steps of the display device can be reduced.

The display device may further include a spacer that is arranged between the housing portion and the drive board. By arranging the spacer between the housing portion and the drive board, the drive board may be held steady.

The lighting device may further include a lighting device that is arranged on a rear side of the display panel and configured to emit light toward a rear surface of the display panel. The display panel may be configured to display the image on the front side using the light on the rear surface of the display panel.

In the display device, the lighting device may include a light source and a light guide plate. The light guide plate may be a plate-like member and may include at least one light entrance surfaces and a light exit surface. The at least one light entrance surface may be at least one end surface of the plate-like member. Light enters the light guide plate through the light entrance surface. The light exit surface may be a front plate surface of the plate-like member. The light in the light guide plate from the light entrance surface may exit toward the rear surface of the display panel through the light exit surface. The frame may include a light guide plate contact portion that in contact with a light guide plate and holds the light guide plate.

The display device may further include a chassis that is arranged opposite a rear plate surface of the light guide plate. The chassis may hold the display panel and the light guide plate between the chassis and the frame.

In the display device, the light guide plate contact portion may be provided with the frame portion and in contact with a peripheral area of the light exit surface. The light guide plate contact portion may hold the light guide plate between the light guide plate contact portion and the chassis.

In the display device, the light guide plate contact portion may be opposite the housing portion and include a chamfer on a sidewall side. With this configuration in which the guide plate contact portion is opposite the housing portion and includes the chamfer on the sidewall side, when the drive board is inserted into the groove of the housing portion, the drive board is less likely to be stuck by a part of the guide plate contact portion on the sidewall side. Therefore, the drive board is less likely to be obstructed during insertion.

In the display device, the light guide plate contact portion may include a plurality of light guide plate contact portions that are aligned at an interval along the peripheral area of the light exit surface. A wiring path may be provided between the light guide plate contact portions adjacent to each other. The flexible wiring may be arranged in the wiring path.

In the display device, the void may be provided in a position opposite the wiring path. In this configuration in which the void is located opposite the wiring path, a larger space is provided between the housing portion and the frame portion, especially, in an area around the void. Therefore, a worker can easily attach the drive board to the housing portion or detach the drive board from the housing portion.

In the display device, the display panel may be a liquid crystal panel including a pair of substrates with liquid crystals sealed therebetween.

A television device according to this invention may include the display device.

Advantageous Effect of the Invention

According to this invention, the display device that houses the drive board without affecting a reduction in size of the frame can be provided.

MODE FOR CARRYING OUT THE INVENTION

<First Embodiment>

A first embodiment of this invention will be described with reference to FIGS. 1 to 8. According to this embodiment, a television device TV, a liquid crystal display device 10, and a lighting device 12 will be described. X-axis, Y-axis and Z-axis are indicated in some drawings. The axes in each drawing correspond to the respective axes in other drawings. The upper side and the lower side in FIGS. 3 and 4 correspond to a front side (a display side) and a rear side (a back side), respectively.

Figure 1:
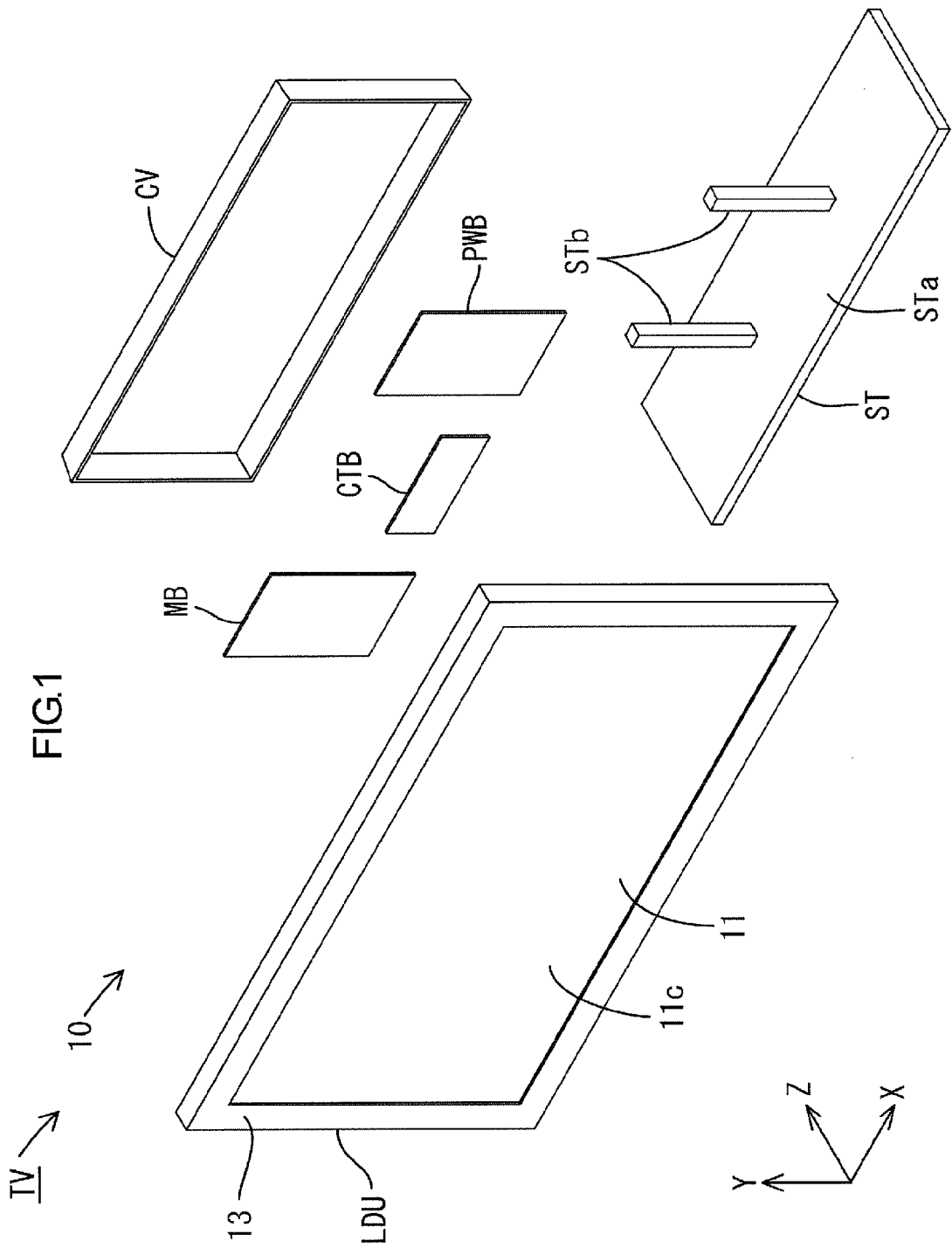
FIG. 1 is an exploded perspective view illustrating a general configuration of a television device TV according to a first embodiment of the invention.
Figure 2:
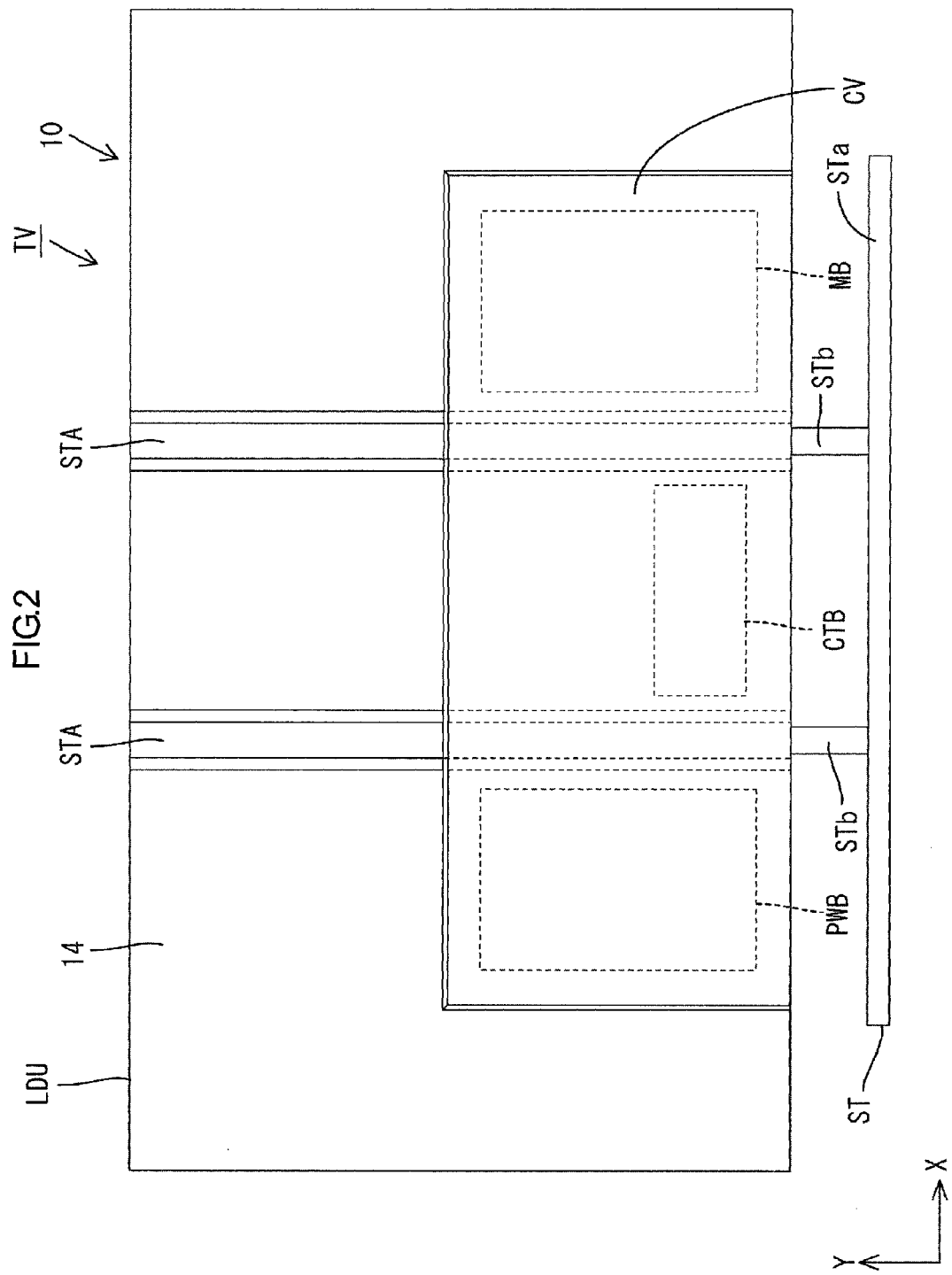
FIG. 2 is a back view of the television device.

FIG. 1 is an exploded perspective view illustrating a general configuration of the television device TV according to the first embodiment of this invention. FIG. 2 is a back view of the television device TV. As illustrated in FIG. 1, the television device TV according to this embodiment includes a liquid crystal display unit LDU, boards PWB, MB, and CTB, a cover CV, and a stand ST. The boards PWB, MB, and CTB are attached on a rear side (a back side) of the liquid crystal display unit LDU. The cover CV is attached on the rear side of the liquid crystal display unit LDU so as to cover the boards PWB, MB, and CTB. The stand ST supports the liquid crystal display unit LDU such that a display surface $11c$ of the liquid crystal display unit LDU extends in a vertical direction (the Y-axis direction).

The liquid crystal display device 10 according to this embodiment has the same configuration as the television device TV except for at least a component (e.g. a tuner included in the main board MB) for receiving television signals. The liquid crystal display unit LDU has a landscape rectangular shape as a whole. The liquid crystal display unit LDU includes a liquid crystal panel 11 as a display panel and a backlight device (a lighting device) 12 held together by a frame 13 and a chassis 14, which provide an external configuration of the liquid crystal display device 10.

As illustrated in FIG. 2, stand fitting members STA are attached to a rear surface of the chassis 14. The rear surface of the chassis 14 provides an external configuration of the back of the liquid crystal display device 10. The stand fitting members STA are away from each other in the X-axis direction and extend along the Y-axis direction on the chassis 14. Each stand fitting member STA has a cross section corresponds to a cross section of a channel beam and opens to the chassis 14. A space is provided between the stand fitting member STA and the chassis 14. Support portions STb included in the stand ST are arranged in the spaces provided between the stand fitting members STA and the chassis 14. The spaces provided inside the stand fitting members STA are paths for wiring members (e.g. electric wires). The wiring members are connected to LED boards 18 included in the backlight device 12. The stand ST includes a base STa and the support portions STb. The base STa extends parallel to the X-Z plane. The support portions STb stand on the base STa in the Y-axis direction. The cover CV is made of synthetic resin. The cover CV is attached to a part of the rear surface of the chassis 14. Specifically, the cover CV covers a substantially lower half part (refer to FIG. 2) of the chassis 14 so as to cross over the stand fitting members STA in the X-axis direction. A component storage space is provided between the cover CV and the chassis 14 such that the boards PWB, MB, and CTB, which will be described next, are arranged therein.

AS illustrated in FIG. 2, the liquid crystal display device 10 includes a power source board PWB, a main board MB, and a control board CTB as the boards PWB, MB, and CTB, respectively. The power source board PWB is a power source of the liquid crystal display device 10. The power source board PWB supplies drive power to the other boards MB and CTB and to LEDs 17 included in the backlight device 12. The main board MB includes a tuner and an image processor, which are not illustrated. The tuner is configured to receive television signals. The image processor performs image processing on the received television signals. The main board MB is configured to output the processed image signals to the control board CTB. If an external image reproducing device, which is not illustrated, is connected to the liquid crystal display device 10, image signals from the image reproducing device are input to the main board MB. The image processor included in the main board MB processes the image signals, and the main board MB outputs the processed image signals to the control board CTB. The control board CTB is configured to convert the image signals, which are sent from the main board MB, to driving signals for liquid crystals and to supply the driving signals to the liquid crystal panel 11.

Figure 3:
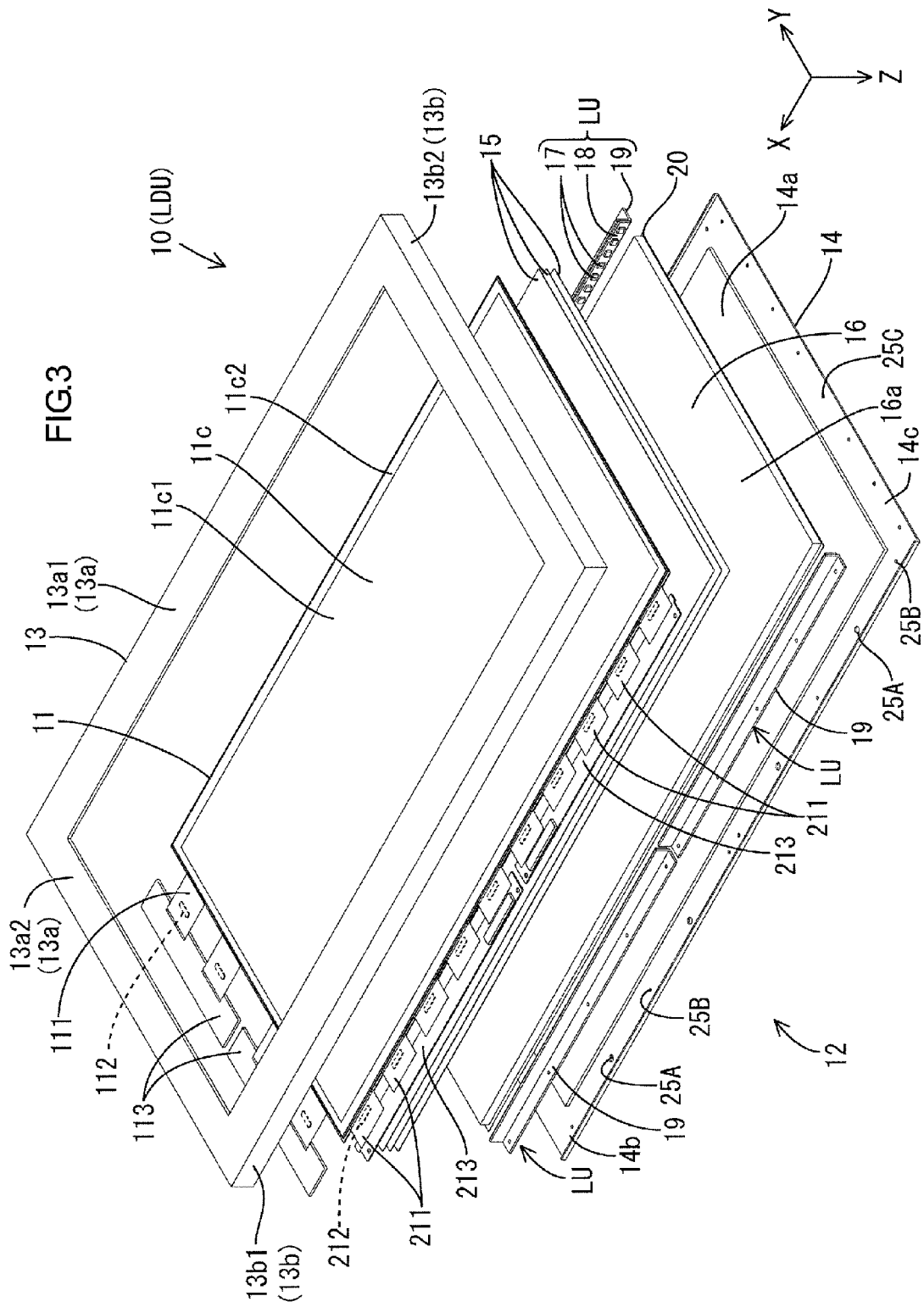
FIG. 3 is an exploded perspective view illustrating a general configuration of a liquid crystal display unit in a liquid crystal display device.
Figure 4:
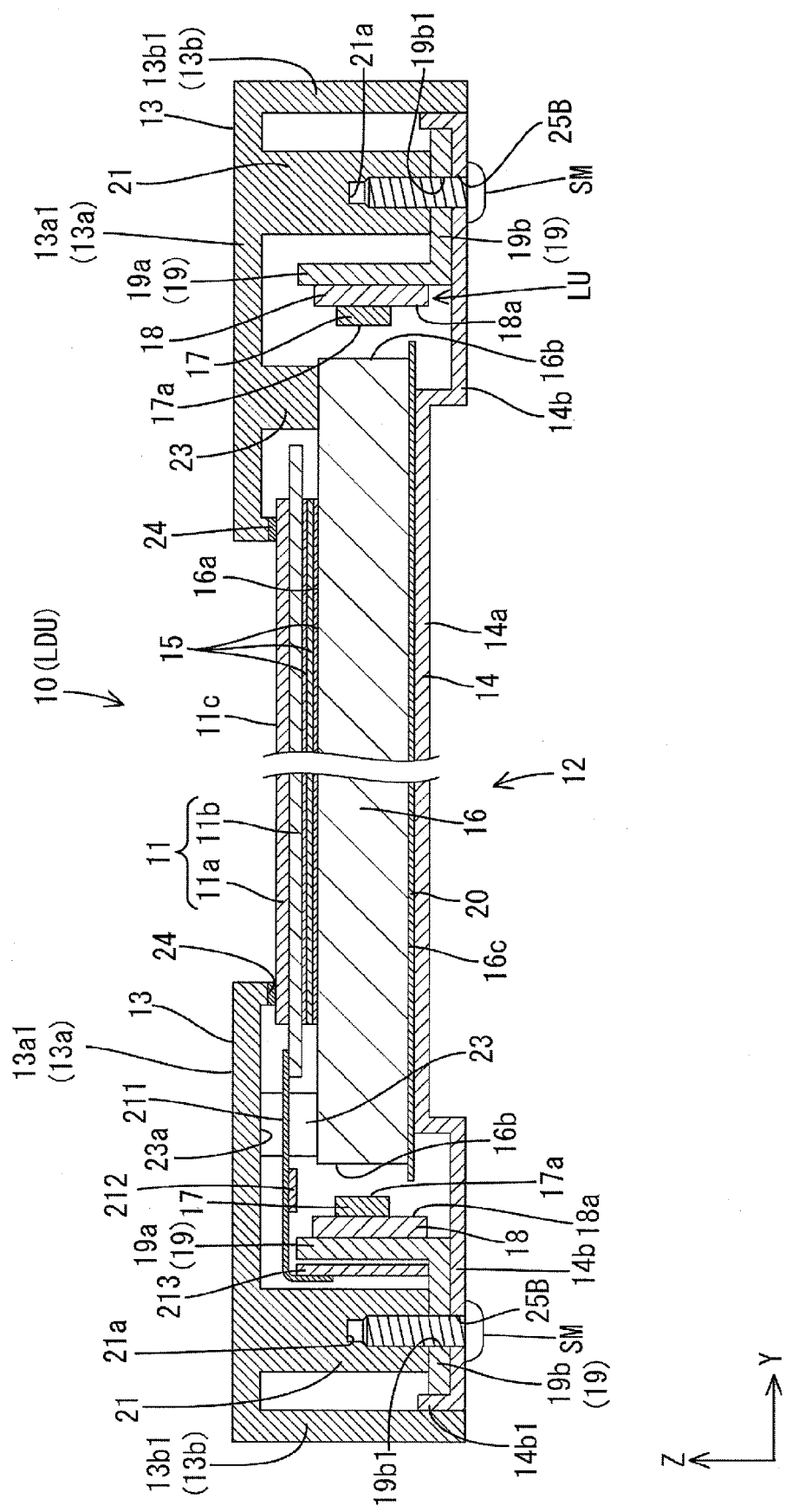
FIG. 4 is a cross-sectional view of the liquid crystal display device taken along a short-side direction thereof.
Figure 5:
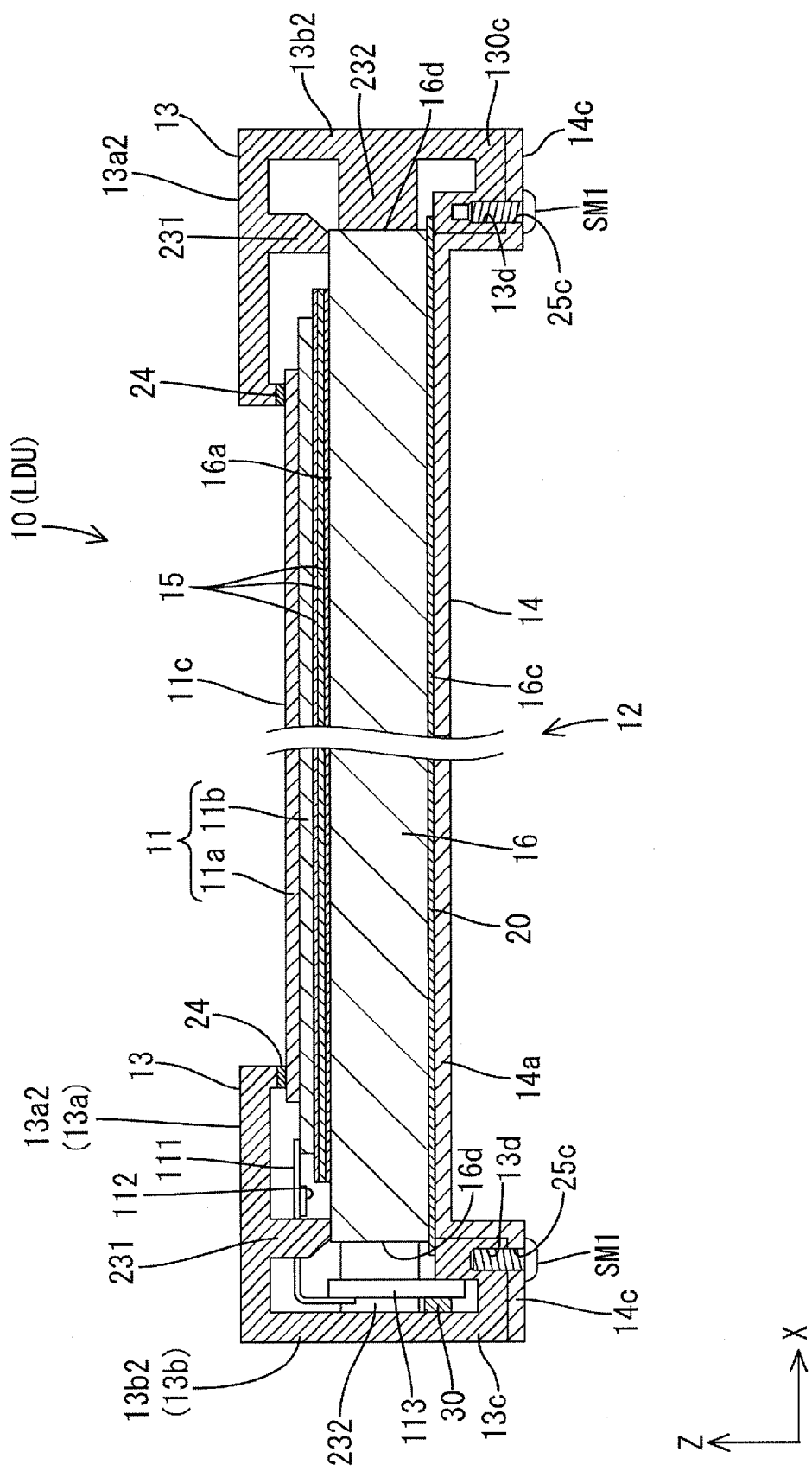
FIG. 5 is a cross-sectional view of the liquid crystal display device taken along a long-side direction thereof.

FIG. 3 is an exploded perspective view illustrating a general configuration of the liquid crystal display unit LDU included in the liquid crystal display device 10. FIG. 4 is a cross-sectional view illustrating a part of the liquid crystal display device 10 taken along a short-side direction thereof. FIG. 5 is a cross-sectional view illustrating a part of the liquid crystal display device 10 taken along a long-side direction thereof, and is a magnified cross-sectional view of the liquid crystal display device illustrated in FIG. 5. As illustrated in FIGS. 3 and 5, main components of the liquid crystal display unit LDU included in the liquid crystal display device 10 are arranged between the frame (a front frame) 13 arranged on the front side and the chassis (a rear chassis) 14 arranged on the rear side. The main components arranged between the frame 13 and the chassis 14 include at least the liquid crystal panel 11, optical members 15, a light guide plate 16, LED units (light source units) LU, and a reflection sheet 20. The liquid crystal panel 11, the optical members 15, the light guide plate 16, and the reflection sheet 20 are placed on top of one another and held between the front frame 13 and the rear chassis 14. The backlight device 12 includes the optical members 15, the light guide plate 16, LED units LU, the chassis 14, and the reflection sheet 20 as the main components. The LED units LU are arranged along long-side end surfaces of the light guide plate 16 between the frame 13 and the chassis 14. The LED units LU each include the LEDs (LED light sources) 17, LED boards (light source boards) 18 on which the LEDs 17 are mounted, and heat dissipation members (light source holding members) 19.

As illustrated in FIG. 3, the liquid crystal panel 11 has a landscape rectangular shape in a plan view. The liquid crystal panel 11 includes a pair of glass substrates 11a and 11b and liquid crystals. The substrates 11a and 11b having high light transmissivity are bonded together with a predetermined gap therebetween. The liquid crystals are sealed between the substrates 11a and 11b. One of the substrates 11a and 11b on the front side is a color filter (hereinafter referred to as CF) substrate 11a and the other one of the substrates 11a and 11b on the rear side (on the backside) is an array substrate 11b. On the TFT array substrate 11b, switching elements (e.g. Thin Film Transistors: TFTs), pixel electrodes, and an alignment film are arranged. The switching elements are connected to gate lines and source lines that are arranged perpendicular to each other. The pixel electrodes are connected to the switching elements. Specifically, the TFTs and the pixel electrodes are aligned on the array substrate 11b, and the gate lines and source lines are arranged in a matrix so as to surround the TFTs and the pixel electrodes. The gate lines and the source lines are connected to gate electrodes and source electrodes of the TFTs, respectively. The pixel electrodes are connected to drain electrodes of the TFTs. Capacitor lines (sub capacitor lines, storage capacitor lines, and Cs lines) are arranged on the array substrate 11b so as to be parallel to the gate lines and overlap the pixel electrodes in a plan view. The capacitor lines and the gate lines are alternately arranged in the Y-axis direction. On the CF substrate 11a, color filters, a counter electrode, and an alignment film are arranged. The color filters include red (R), green (G), and blue (B) color portions that are arranged in a predetermined arrangement. Polarizing plates, which are not illustrated, are arranged on outer sides of the substrates 11a and 11b.

As illustrated in FIGS. 4 and 5, the array substrate 11b has a larger size than the CF substrate 11a in a plan view. The array substrate 11b is arranged such that each end of the array substrate 11b protrudes to an outer side with respect to each end of the CF substrate 11a. Specifically, the array substrate 11b is slightly larger in size than the CF substrate 11a such that an entire outer peripheral end of the array substrate 11b protrudes outwardly from an entire outer peripheral end of the CF substrate 11a. The outer peripheral end of the array substrate 11b includes a pair of long-side ends. In one of long-side end portions of the array substrate 11b that is close to the control board CTB with respect to the Y-axis direction (on a front side in FIG. 3 or on a left side in FIG. 4), source terminals extended from the source lines are arranged. As illustrated in FIG. 3, flexible boards (flexible lines) 211 on a source side are connected to the respective source terminals. The flexible boards 211 on the source side are arranged apart from each other in the X-axis direction (a direction along the long-side end of the array substrate 11b). A part of each flexible board 211 on the source side protrudes from the long-side end of the array substrate 11b to the outer side in the Y-axis direction.

The outer peripheral end of the array substrate 11b includes a pair of short-side ends. Multiple gate terminals extended from the gate lines and the capacitor lines are arranged in one of short-side end portions of the array substrate 11b (on a far end side in FIG. 3 or on a left side in FIG. 5). Flexible boards (flexible lines) 111 are connected to the respective gate terminals. The flexible boards 111 on a gate side are arranged apart from each other in the Y-axis direction, i.e., a direction along the short-side end of the array substrate 11b. A part of each flexible board 111 on the gate side protrudes to an outer side with respect to the short-side end of the array substrate 11b in the X-axis direction.

The flexible boards 111, 211 include film-like bases and drivers (panel drive components) 112, 211 for driving the liquid crystals. The bases are made of synthetic resin that has insulation properties and flexibility such as polyimide resin. Traces (not illustrated) are arranged on each base and connected to the corresponding driver 112, 212 that is mounted on about a center of the corresponding base. The flexible boards 111, 211 on which the respective drivers 112, 211 are mounted are so-called System on Films (SOF). One end of each flexible board 211 on the source side is pressed and connected to each source terminal of the array substrate 11b via an anisotropic conductive film (ACF). Another end of each flexible board 211 on the source side is pressed and connected to each terminal of a printed circuit board (source board) 213 on the source side, which will be described later, via another anisotropic conductive film. The printed circuit boards 213 are connected to the control board CTB via wiring members, which is not illustrated. The printed circuit boards 213 transmit signals from the control board CTB (scanning signals to the gate lines, data signals to the source lines, and capacitor signals to the capacitor lines) to the flexible boards 211 on the source side. Each printed circuit board 213 has an elongated (belt-like) shape. Two printed circuit boards 213 are used in this embodiment. The printed circuit boards 213 are aligned in line and connected to the respective flexible boards 211. Each printed circuit board 213 has about a half-length of a long-side in the liquid crystal panel 11. One end of each flexible board 111 on the gate side is pressed and connected to each gate terminal of the array substrate 11b via another anisotropic conductive film (ACF). Another end of each flexible board 111 is pressed and connected to each terminal (not illustrated) of a printed circuit board 113 on the gate side, which will be described later, via another anisotropic conductive film. Each printed circuit board 113 has an elongated (a belt-like) shape. Two printed circuit boards 113 are used in this embodiment. The printed circuit boards 113 are aligned in line and connected to the respective flexible boards 11. Each printed circuit board 113 has about a half-length of a short-side in the liquid crystal panel 11. Relay lines (not illustrated) which connect the source terminals and gate terminals are arranged on the array substrate 11b. Through the relay lines, the signals (e.g. the scanning signals to the gate lines and the capacitor signals to the capacitor line) sent from the control board CTB are transmitted to the gate terminals and the flexible boards 111 on the gate side and the printed circuit boards. The liquid crystal panel 11 thus displays images on the display surface 11c according to the signals from the control board CTB.

As illustrated in FIGS. 3 to 5, the liquid crystal panel 11 is placed on a front side (a light exit side) of the optical members 15. A rear surface of the liquid crystal panel 11 (a rear surface of the polarizing plate on the rear side) is fitted to the optical members 15 with minimal gaps therebetween. Therefore, dust is less likely to enter the gaps between the liquid crystal panel 11 and the optical members 15. The display surface (a front plate surface) 11c in the liquid crustal panel 11 includes a display area 11c1 and a non-display area 11c2. The display area 11c1 is an inner area of a screen in which images are displayed. The non-display area 11c2 is an outer area of the screen around the display area and has a frame-like shape. The terminals and the flexible boards 111, 211 described earlier are arranged in the non-display area 11c2.

As illustrated in FIG. 3, similar to the liquid crystal panel 11, the optical members 15 each have a landscape rectangular shape in a plan view and have the same size as (a short-side dimension and a long-side dimension) that of the liquid crystal panel 11. The optical members 15 are placed on the front side (a light exit side) of the light guide plate 16, which will be described later, and sandwiched between the light guide plate 16 and the liquid crystal panel 11. The optical members 15 include three sheets placed on top of one another. Specifically, the optical members 15 may be selected, as appropriate, from diffuser sheets, lens sheets, and reflecting type polarizing sheets.

The light guide plate 16 is made of substantially transparent (high transmissivity) synthetic resin (e.g. acrylic resin or polycarbonate such as PMMA) which has a refractive index sufficiently higher than that of the air. As illustrated in FIG. 3, the light guide plate 16 has a landscape rectangular shape in a plan view similar to the liquid crystal panel 11 and the optical members 15. A thickness of the light guide plate 16 is larger than a total thickness of the optical members 15. A long-side direction and a short-side direction of a main surface of the light guide plate 16 correspond to the X-axis direction and the Y-axis direction, respectively. A thickness direction of the light guide plate 16 that is perpendicular to the main surface of the light guide plate 16 corresponds to the Z-axis direction. As illustrated in FIGS. 4 and 5, the light guide plate 16 has a size (a short-side dimension and a long-side dimension) larger than those of the liquid crystal panel 11 and the optical members 15 when seen from a plan view. The light guide plate 16 is arranged in the lighting device 12 such that end portions of the light guide plate 16 each protrude to an outer side with respect to each end of the liquid crystal panel 11.

The light guide plate 16 is slightly larger in size than the liquid crystal panel 11 such that the end portions of the light guide plate 16 protrude outwardly from an outer peripheral portion of the array substrate 11b of the liquid crystal panel 11. The light guide plate 16 is arranged on the rear side of the optical members 15 and sandwiched between the optical members 15 and the chassis 14. The LED units LU are arranged on long-side end portions of the light guide plate 16. Light from the LED units LU enters the light guide plate 16 through the ends of the light guide plate 16. The light guide plate 16 is configured to guide the light, which is from the LED units LU and enters the light guide plate 16 through the long-side end portions, toward the optical members 15 (on the front side).

As illustrated in FIG. 4, one of plate surfaces of the light guide plate 16 that faces the front side (a surface opposite the optical members 15) is a light exit surface 16a. Light exits the light guide plate 16 through the light exit surface 16a toward the optical members 15 and the liquid crystal panel 11. The light guide plate 16 includes outer peripheral end surfaces that are adjacent to the main surfaces of the light guide plate 16, and two end surfaces thereof each extend in the X-axis direction are elongated long-side surfaces (end surfaces in the short-side direction). Each long-side surface is opposite the LEDs 17 (the LED boards 18) with a predetermined space therebetween and serves as light entrance surfaces 16b through each of which light from LEDs 17 enters. The light entrance surfaces 16b are parallel to the X-Z plane (main surfaces of the LED boards 18) and substantially perpendicular to the light exit surface 16a. Two end surfaces of the outer peripheral end surfaces of the light guide plate 16 are short-side end surfaces 16d. The short-side end surfaces 16d are in contact with guide plate holding portions 232, which will be described later.

The reflection sheet 20 is arranged on the rear side of the light guide plate 16. Some rays of light through the light guide plate 16 are reflected by the reflection sheet 20 toward the light exit surface 16 side. The reflection sheet 20 is arranged to cover an entire area of a rear plate surface 16c of the light guide plate 16. The reflection sheet 20 is arranged between the chassis 14 and the light guide plate 16. The light guide reflection sheet 20 is made of a foamed plastic sheet that has a white surface having high light reflectivity (e.g. a foamed polyethylene terephthalate sheet). As illustrated in FIG. 4, at least a short-side dimension of the reflection sheet 20 is larger than that of the light guide plate 16. The reflection sheet 20 is arranged such that ends in the short-side direction thereof protrude closer to the LEDs 17 compared to the light entrance surfaces 16b of the light guide plate 16.

At least one of the light exit surface 16a and the rear plate surface 16c of the light guide plate 16 has a reflection portion (not illustrated) or a scattering portion (not illustrated). The reflection portion is configured to reflect the light inside the light guide plate 16. The scattering portion (not illustrated) is configured to scatter the light inside the light guide plate 16. The reflection portion or the scattering portion may be formed by patterning so as to have a specified in-plane distribution. This configuration regulates the light from the light exit surface 16a to have an even in-plane distribution.

Next, a configuration of each of the LEDs 17, the LED board 18, and the heat dissipation member 19 included in the LED unit LU will be described. As illustrated in FIGS. 3 and 4, each LED 17, which is included in the LED unit LU, includes an LED chip arranged on a board that is fixed on the LED board 18 and sealed with resin. The LED chip mounted on the board has one main light emission wavelength. Specifically, the LED chip that emits light in a single color of blue is used. The resin that seals the LED chip contains phosphors dispersed therein. The phosphors emit light in a predetermined color when excited by blue light emitted from the LED chip. Thus, overall color of light through the resin is white. The phosphors may be selected, as appropriate, from yellow phosphors that emit yellow light, green phosphors that emit green light, and red phosphors that emit red light. The phosphors may be used in combination of the above phosphors. The LED 17 includes a main light-emitting-surface 17a that is opposite to a surface on which the LED board 18 is mounted (a surface opposite the light entrance surfaces 16b of the light guide plate 16). Namely, the LED 17 is a top-surface-emitting type LED.

As illustrated in FIGS. 3 and 4, each LED board 18 has an elongated plate-like shape and extends in the long-side direction of the light guide plate 16 (the X-axis direction, the long-side direction of the light entrance surface 16b). The LED boards 18 are arranged in a space between the frame 13 and the chassis 14 such that a main surface of each LED board 18 is parallel to the X-Z plane, i.e., parallel to the light entrance surface 16b of the light guide plate 16. Each LED board 18 has a long-side length (dimension) which is about a half of the long-side length (dimension) of the light guide plate 16. The LED board 18 includes a plate surface (a mount surface 18a) which is opposite the light guide plate 16. The LEDs 17 are mounted on the mount surface 18a. The LEDs 17 are arranged in line (i.e., linearly) at intervals on the mount surface 18a of the LED board 18 along the long-side direction of the LED board 18 (the X-axis direction). The lines of the LEDs 17 are parallel to the long-side direction of the light guide plate 16. Distances between the adjacent LEDs 17 in the X-axis direction are substantially equal, that is, the LEDs 17 are arranged at substantially equal intervals. An arrangement direction of the LEDs 17 corresponds to the longitudinal direction of the LED board 18 (the X-axis direction).

A Metal-film trace (not illustrated), such as copper-foil trace, is formed on the mount surface 18a of the LED board 18. The metal-film trace extends in the X-axis direction and crosses over a group of the LEDs 17 so as to connect the adjacent LEDs 17 in series. Terminals at ends of the trace are electrically connected to the power source board PWB via wiring members including connecters and electric wires. Thus, driving power is supplied to the LEDs 17. The LED boards 18 in a pair that are arranged so as to sandwich the light guide plate 16 therebetween are arranged in the spaces between the frame 13 and the chassis 14 such that the mount surfaces 18a on which the LEDs 17 are mounted face each other. The main light-emitting-surfaces 17a of the LEDs 17 on one of the LED boards 18 face the main light-emitting-surfaces 17a of the LEDs 17 on the other one of the LED boards 18. A light axis of each LED 17 is substantially corresponds to the Y-axis direction. A substrate of each LED board 18 is made of metal such as aluminum. Traces (not illustrated) are formed on the surface of the LED board 18 via an insulating layer. A material used for LED boards 18 may be an insulating material including ceramic.

As illustrated in FIGS. 3 and 4, the heat dissipation member 19 included in each LED unit LU is made of metal having high thermal conductivity, such as aluminum. The heat dissipation member 19 has a bent shape with an L-shaped cross section and includes an LED attachment portion (light source attachment portion) 19a and a heat dissipation portion 19b. The LED board 18 is attached on the LED attachment portion 19a. The heat dissipation portion 19b is in surface-contact with a plate surface of the chassis 14. The heat dissipation member 19 has a long-side dimension substantially equal to the long-side dimension of the LED board 18. The LED attachment portion 19a has a plate-like shape parallel to the plate surface 18a of the LED board 18 and the light entrance surface 16b of the light guide plate 16. A long-side direction, a short-side direction, and a thickness direction of the LED attachment portion 19a are illustrated in some figures so as to correspond to the X-axis direction, the Z-axis direction, and the Y-axis direction, respectively. The LED board 18 is mounted on an inner plate surface of the LED attachment portion 19a, that is, a plate surface that faces the light guide plate 16. While the LED attachment portion 19a has a long-side dimension that is substantially equal to the long-side dimension of the LED board 18, a short-side dimension of the LED attachment portion 19a is larger than a short-side dimension of the LED board 18. Therefore, ends of the LED attachment portion 19a in the short-side direction protrude to an outer side with respect to the LED board 18 in the Z-axis direction.

An outer plate surface of the LED attachment portion 19a, that is, a plate surface opposite to the plate surface on which the LED board 18 is attached, faces a screw attachment portion 21 included in the frame 13, which will be described later. The LED attachment portion 19a is located between the screw attachment portion 21 of the frame 13 and the light guide plate 16 in the display device 12. The LED attachment portion 19a extends from an inner end of the heat dissipation portion 19b, i.e., an end of the heat dissipation portion 19b on the LEDs 17 (the light guide plate 16) side, toward the front side in the Z-axis direction (a direction in which the liquid crystal panel 11, optical members 15, and the light guide plate 16 overlap each other), i.e., toward the front side.

As illustrated in FIGS. 3 and 4, the heat dissipation portion 19b has a plate-like shape and is parallel to the plate surface of the chassis 14. A long-side direction, a short-side direction, and a thickness direction of the heat dissipation portion 19b are illustrated in some figures so as to correspond to the X-axis direction, the Y-axis direction, and the Z-axis direction, respectively. The heat dissipation portion 19b extends from a rear-side end of the LED attachment portion 19a toward the outer side in the Y-axis direction. In other words, the heat dissipation portion 19b extends from an end of the LED attachment portion 19a closer to the chassis 14 toward a counter direction from the light guide plate 16. The heat dissipation portion 19b has a long-side dimension substantially equal to the long-side dimension of the LED attachment portion 19a. An entire rear plate surface of the heat dissipation portion 19b, i.e., a plate surface of the heat dissipation portion 19b facing the chassis 14, is in surface-contact with the plate surface of the chassis 14. A front plate surface of the heat dissipation portion 19b, i.e., a plate surface opposite from the surface in contact with the chassis 14, faces the screw attachment portion 21 of the frame 13, which will be described later. Specifically, the front plate surface of the heat dissipation portion 19b is in contact with a projected end surface of the screw attachment portion 21. The heat dissipation portion 19b is sandwiched between the screw attachment portion 21 of the frame 13 and the chassis 14. With this configuration, heat generated by the lightened LEDs 17 is transferred to the chassis 14 and the frame 13 including the screw attachment portion 21 via the LED board 18, the LED attachment portion 19a, and the heat dissipation portion 19b. Therefore, heat from the LEDS 17 is effectively released to the outside of the liquid crystal display device 10 and thus the heat is less likely to stay therein. The heat dissipation portion 19b includes through holes 19b1 through which screw member SM are passed. The heat dissipation portion 19b is fixed to the screw attachment portion 21 with the screw members SM.

Next, configurations of the frame 13 and the chassis 14 will be described. The frame 13 and the chassis 14 are made of metal such as aluminum so as to have high mechanical strength (rigidity) and high thermal conductivity. While the LED units LU are arranged in the space between the frame 13 and the chassis 14, the frame 13 and the chassis 14 hold the liquid crystal panel 11, the optical members 15, and the light guide plate 16, and the reflection sheet 20, which are placed on top of the other, from the front side and the rear side.

As illustrated in FIG. 3, the frame 13 has a landscape rectangular shape that surrounds the display area 11c1 of the display surface 11c of the liquid crystal panel 11. The frame 13 includes a frame portion 13a and a sidewall 13b as the main components. The frame portion 13a having a frame-like shape is arranged on the front side of the liquid crystal panel 11. The sidewall 13b extends from outer edges of the frame portion 13a toward the rear side (a back side of the liquid crystal panel 11). The frame portion 13a includes long frame portions 13a1 and short frame portions 13a2. The long frame portions 13a1 are located in long-side portions of the frame 13. The short frame portions 13a2 are located in short-side portions of the frame 13. The sidewall 13b includes long sidewall portions 13b1 and short sidewall portions 13b2. The long sidewall portions 13b1 are located in the long-side portions of the frame 13. The short sidewall portions 13b2 are located in the short-side portions of the frame 13. The two long-side portions of the frame 13 have similar configurations. Configurations of the two short-side portions of the frame 13 are basically the same except that only one of the short-side portions of the frame 13 holds the printed circuit board 113 therein.

The frame portion 13a is arranged on the front side of the liquid crystal panel 11 and covers the non-display area 11c2 of the display surface 11c. Each of the long frame portion 13a1 and the short frame portion 13a2 having a plate-like shape and a predetermined thickness extends along the plate surface (a plate surface of the liquid crystal panel 11) of the chassis 14. As illustrated in FIG. 4, the screw attachment portions 21, the guide plate holding portions 23, and projection portions 24 each project from a back surface of the corresponding long frame portion 13a1 toward the lower side in FIG. 4 (a chassis 14 side). The projection portion 24 is configured to press the liquid crystal panel 11. Among the portions 21, 23, and 24, the screw attachment portion 21 is in the closest position to the corresponding sidewall 13b, and the protrusion 24 is in the closest position to a corresponding inner edge. Further, among the portions 21, 23, and 24, the screw attachment portion 21 projects the most to the rear side (the chassis 14 side) and the projection portion 24 projects the least to the rear side (the chassis 14 side). The screw attachment portion 21 has an elongated shape that extends along the long-side direction of the frame 13 (the frame portion 13a). A groove 21a in which the screw members SM are screwed is formed in a distal end portion of the screw attachment portion 21. The screw members SM that are passed through screw holes 25 (25A and 25B) of the chassis 14 and the through holes 19b1 of the heat dissipation members 19 are screwed in the groove 21a of the screw attachment portion 21. Thus, the frame 13 and the chassis 14 are fixed to each other.

The guide plate holding portions 23 included in the long frame portions 13a1 press the respective long-side end portions (peripheral areas) of the light guide plate 16 from the front side toward the chassis 14. Similar to the screw attachment portions 21, each guide plate holding portion 23 has an elongated shape that extends along the long-side direction of the frame 13 (the frame portion 13a). The guide plate holding portion 23 has cutouts 23a in some areas. The cutouts 23a form pathways that run through the guide plate holding portion 23 in the short-side direction (the Y-axis direction) of the frame 13 in some sections of the guide plate holding portion 23. Flexible boards 211 on the source side are passed through the respective cutouts 23a. Between the guide plate holding portion 23 and the corresponding screw attachment portion 21, a gap is provided. The LED boards 18 and the LEDs 17 included in each LED unit LU are arranged in the gap. Another gap is provided between the screw attachment portion 21 and the LED attachment portion 19a of the heat dissipation member 19. The printed circuit boards (source boards) 213 on the source side are arranged in the gap. As illustrated in FIG. 4, each printed circuit board 213 on the source side of this embodiment is in a standing position with respect to the chassis 14 (the liquid crystal panel 11). In other words, the printed circuit board 213 is arranged between the frame 13 and the chassis 14 such that a short-side direction of each printed circuit board 213 is along the thickness direction (the Z-axis direction) of the light guide plate 16.

The projection portion 24 of each long frame portion 13a1 presses a corresponding long-side end portion (the non-display area 11c2) of the liquid crystal panel 11 from the front side toward the chassis 14 (the light guide plate 16). Similar to the screw attachment portion 21, each projection portion 24 having an elongated shape extends along the long-side direction of the frame 13 (the frame portion 13a). The projection portion 24 is an elastic body having light blocking properties such as a black rubber elastic body. The projection portions 24 press the non-display area 11c2 of the liquid crystal panel 11. As illustrated in FIG. 4, a gap is provided between the projection portion 24 and the corresponding guide plate holding portion 23. One of the end portions of the liquid crystal panel 11 that is connected to the flexible boards 211 is arranged in one of the gaps.

As illustrated in FIG. 5, each of the short frame portions 13a2 includes a guide plate holding portion (an example of a guide plate contact portion) 231 and the projection portion 24 similar to ones on the long side. The guide plate holding portion 231 and the projection portion 24 project from a rear surface of a corresponding short frame portion 13a2 toward the lower side (the chassis 14 side) in FIG. 5. The guide plate holding portion 231 of the short frame portion 13a2 presses the corresponding short-side end portion (peripheral area) of the light guide plate 16 from the front side toward the chassis 14. The guide plate holding portion 231 has an elongated shape that extends along a short-side direction of the frame 13 (the frame portion 13a). The guide plate holding portions 231 of the short frame portions 13a2 are connected to the guide plate holding portions 23 of the long frame portions 13a1 at respective ends. In other words, the guide plate holding portions 23 and 231 form a frame-like shape that surrounds the display area 11c1 of the liquid crystal panel 11. The short frame portion 13a2 include cutouts (wiring paths) 240 in some areas. The cutouts 240 are located between the guide plate holding portions 231 so as to form pathways that run through the guide holding portions 231 in the long-side direction (X-axis direction) of the frame 13. The flexible boards 111 are passed through the respective cutouts 240. The guide board holding portions 231 of each short frame portion 13a2 include chamfers 231a, which will be described later.

The projection portion 24 of each short frame portion 13a2 press a corresponding short-side end portion (the non-display area 11c2) of the liquid crystal panel 11 from the front side toward the chassis 14 (the light guide plate 16). The projection portion 24 of the short frame portion 13a2 includes an elongated shape that extends along the short-side direction of the frame 13 (the frame portion 13a). Ends of the projection portion 24 of the short frame portion 13a2 are connected to ends of the projection portions 24 of the long frame portions 13a1. In other words, the projection portions 24 form a frame-like shape that surrounds the display area 11c of the liquid crystal panel 11. The short-side projection portions 24 are elastic bodies, the same as ones on the long side.

The sidewall 13b has a frame-like shape (a hollow shape) which surrounds the liquid crystal panel 11 and extends from the frame portion 13a toward the rear side of the liquid crystal panel 11 (the back side of the liquid crystal display device 12). The sidewall 13b is located at an outer peripheral end of the frame portion 13a. The sidewall 13b surrounds an entire periphery of a layered component that includes the liquid crystal panel 11, the optical members 15, the light guide plate 16, and the reflection sheet 20.

As illustrated in FIG. 4, each long sidewall portion 13b1 has a plate-like shape that extends straight from the outer edge of the corresponding long frame portion 13a1 toward a lower side (the back side of the liquid crystal panel 12, the rear side of the liquid crystal panel 11). As illustrated in FIG. 4, the long sidewall portion 13b1 has a distal end portion. An inner side of the distal end portion is in close-contact with a corresponding end of the chassis 14.

Figure 6:
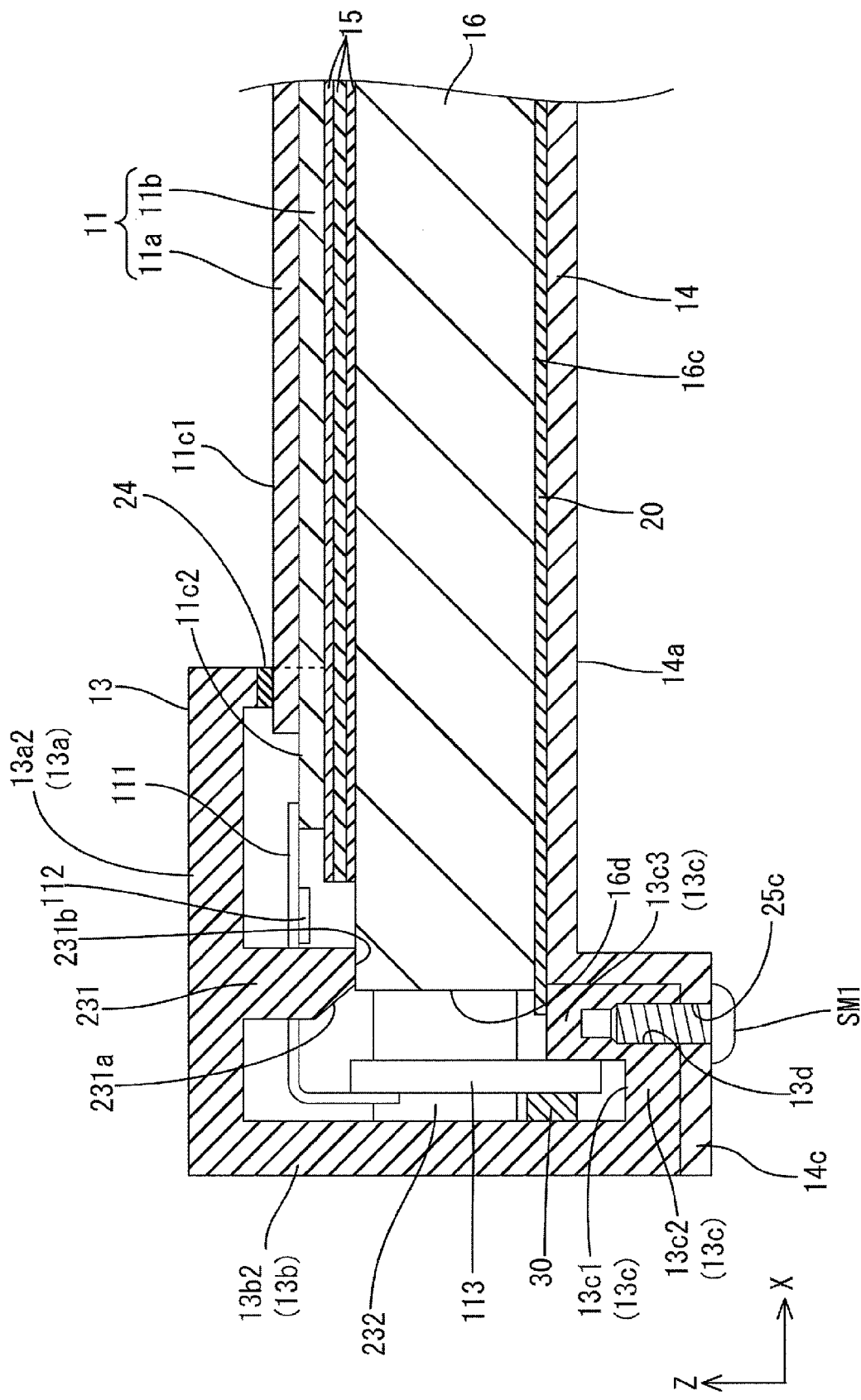
FIG. 6 is a magnified cross-sectional view of the liquid crystal display device illustrated in FIG. 5.

As illustrated in FIGS. 5 and 6, each the short sidewall portion 13b2 has a plate-like shape that extends straight from the outer edge of the corresponding short frame section 13a1 toward the lower side (the back side of the liquid crystal display device 12, the rear side of the liquid crystal panel 11). On a lower inner side (an inside wall side) of the short sidewall portion 13b2, a housing portion 13c for holding the printed circuit boards 113 on the gate side (an example of gate boards or drive boards) is formed. The housing portion 13c has a groove 13c1 that opens to the frame portion 13c. The printed circuit boards 113 are inserted in the groove 13c1 and held by the housing portion 13a.

The housing portion 13c includes a receiving portion 13c2 and an inside wall portion 13c3. The receiving portion 13c2 having a plate-like shape extends from the short sidewall portion 13b2 toward the liquid crystal panel 11. The inside wall portion 13c3 extends from an end of the receiving portion 13c2 toward the frame portion 13a (the short frame portion 13a2). The inside wall portion 13c3 is located a predetermined space away from the short sidewall portion 13b2. Specifically, the receiving portion 13c2 extends along a length direction of the short sidewall portion 13b2 (the short-side direction of the frame 13) parallel to the short frame portion 13a2. The inside wall portion 13c3 extends along the length direction of the short sidewall portion 13b2 (an edge direction of the frame 13) parallel to the short sidewall portion 13b2. The inside wall portion 13c3 has a height (a height from the receiving portion 13c2 toward the frame portion 13a) which is smaller than a height (a height from the receiving portion 13c2 toward the frame portion 13a) of the short sidewall portion 13b2. The height of the inside wall portion 13c3 corresponds to a depth of the groove 13c1. The groove 13c1 of this embodiment is an area defined by the short sidewall portion 13b2, the receiving portion 13c2, and the inside wall portion 13c3. A width of the groove 13c1 (a width in the X-axis direction) is larger than a thickness of the printed circuit board 113. Between the printed circuit board 113 and the short sidewall portion 13b2, a spacer 30 made of an elastic material is arranged.

Figure 7:
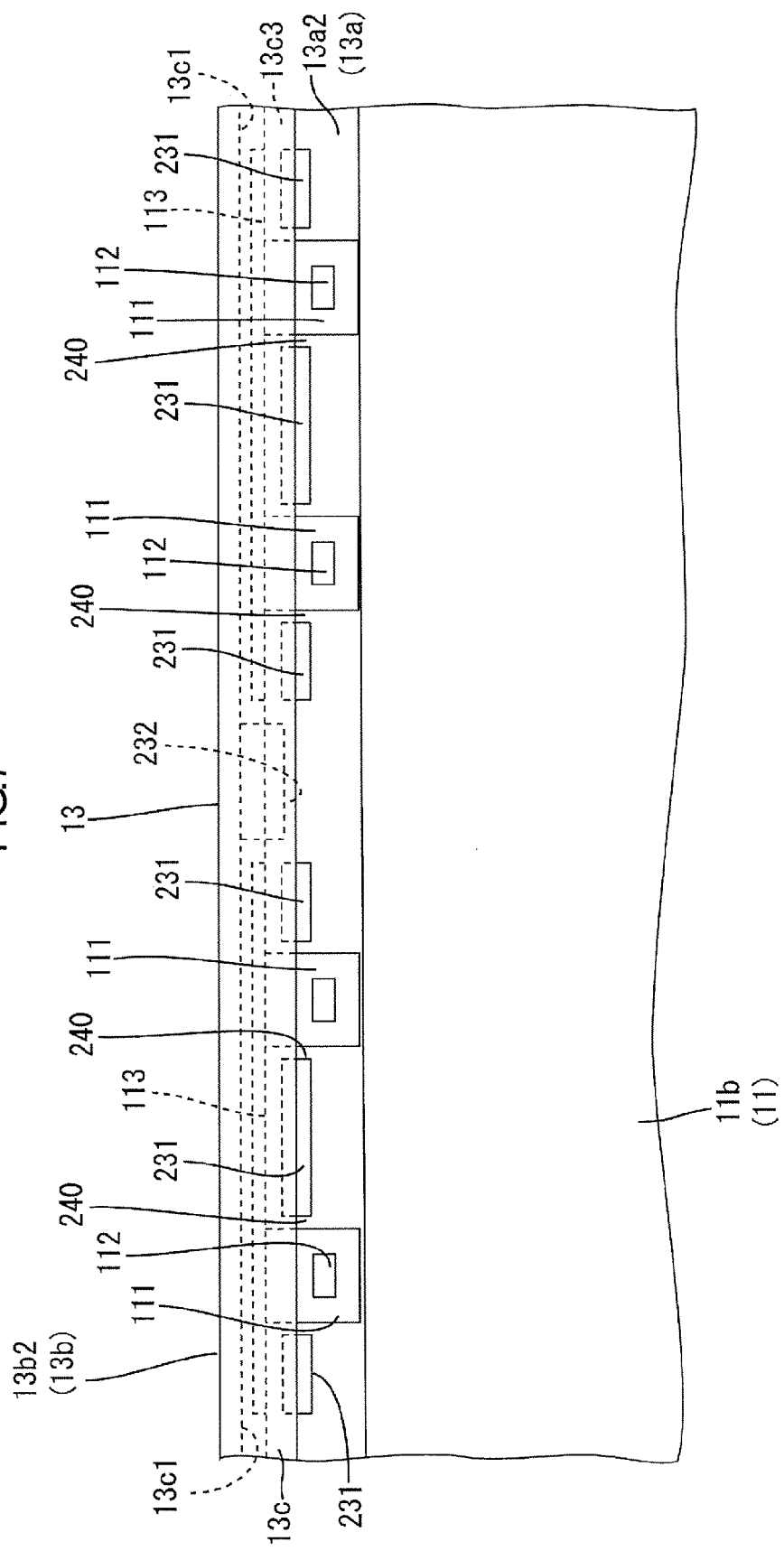
FIG. 7 is a plan view of a back side of a frame, illustrating a part of a housing portion that holds a printed circuit board.
Figure 8:
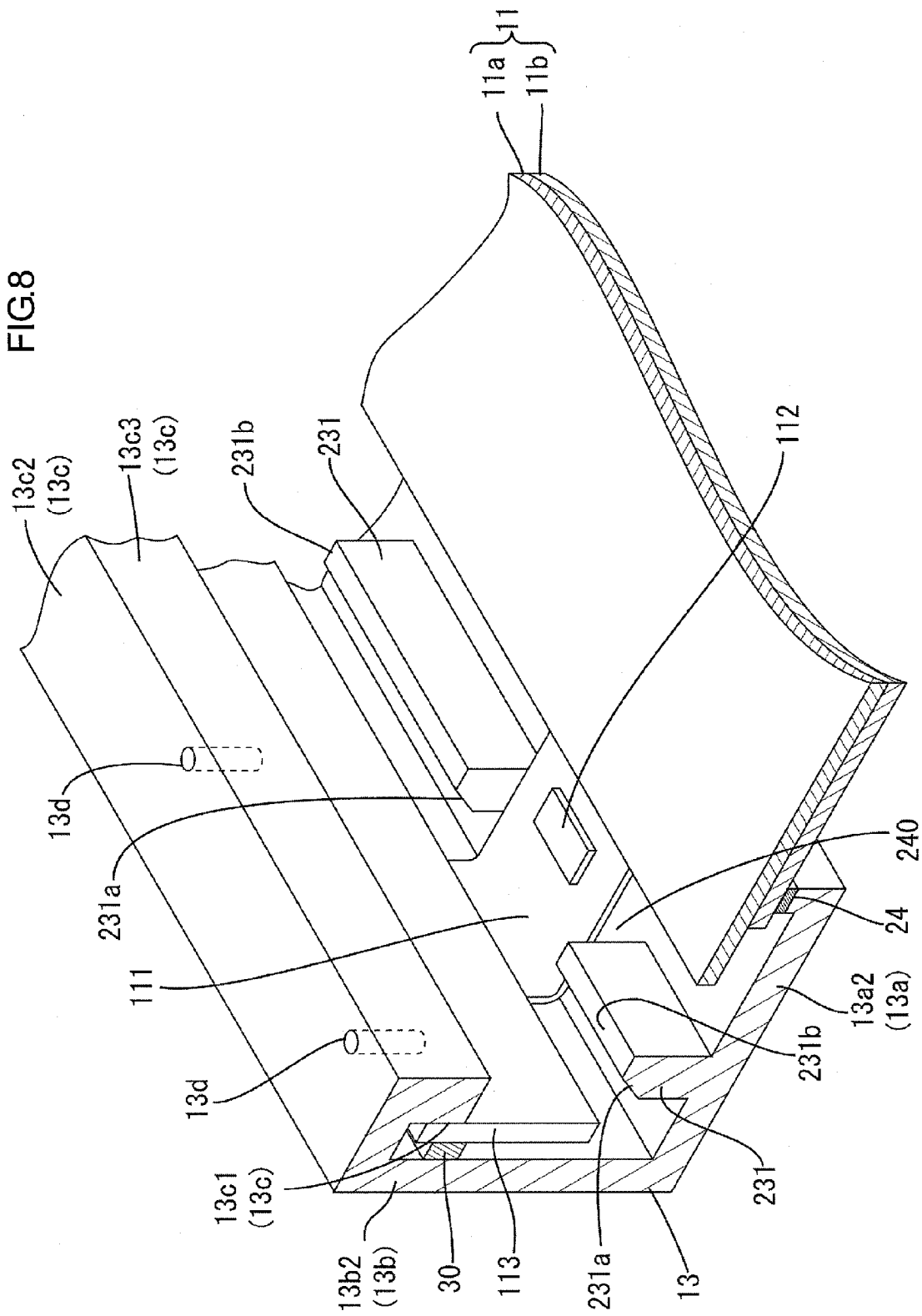
FIG. 8 is a perspective view of the back side of the frame, illustrating a part of the housing portion that holds the printed circuit board.

FIG. 7 is a plan view of the back side of the frame 13, illustrating a part of the housing portion 13c that holds the printed circuit board 113. FIG. 8 is a perspective view of the back side of the frame 13, illustrating a part of the housing portion 13c that holds the printed circuit board 113. FIG. 7 illustrates one of the short-side end portions of the liquid crystal panel 11 that is placed on a back side of the frame portion 13a (the short frame portion 13a2) of the frame 13. The flexible boards 111 on the gate side are arranged on the end portion of the liquid crystal panel 11. Each of the flexible boards 111 is passed through the corresponding cutout (the wiring paths) 240 that is located between the guide plate holding portions 231 adjacent to each other. The multiple guide plate holding portions 231 protrude from the rear side of the frame portion 13a (the short frame portions 13a2). As illustrated in FIG. 7, the guide plate holding portions 231 are arranged in line along the short-side direction of the frame 13. Each of the guide plate holding portions 231 is parallel to the short sidewall portion 13b2 in the short-side direction of the frame 13. The guide plate holding portion 231 is located a predetermined space away from the short sidewall portion 13b2. Further, the guide plate holding portion 231 is arranged parallel to the short sidewall portion 13b2 in a thickness direction of the liquid crystal panel 11. The guide plate holding portion 231 includes an edge surface 231b and the chamfer 231a at a distal end portion. Each edge surface 231b is a flat surface located on a liquid crystal panel 11 side. Each chamfer 231a is an inclined surface located on a short sidewall portion 13b2 side and adjacent to the edge surface 231b. Namely, the distal end portion of the guide plate holding portion 231 that includes the chamfer 231a has a tapered shape. The guide plate holding portion 231 is opposite the inside wall portion 13c3 included in the housing portion 13c. Specifically, as illustrated in FIG. 7, the guide plate holding portion 231 is opposite the inside wall portion 13c1 such that the distal end portion of the guide plate holding portion 231 partially overlaps a distal end portion of the inside wall portion 13c3. In other words, a part of the guide plate holding portion 231 is off to an inner side (a liquid crystal panel 11 side) with respective to the inside wall portion 13c3 in a view of a chassis 134 on the back side. Each of the short sidewall portions 13b2 includes a guide plate contact portion 232 that is in contact with the corresponding end surface 16d of the light guide plate 16. The guide plate contact portion 232 extends from an inner side (the inside wall side) of the short sidewall portion 13b2 toward the light guide plate 16. An extended end surface of the guide plate contact portion 232 is in contact with the corresponding short-side end surface 16d. Namely, the guide plate contact portions 232 are in contact with both of the short-side end surfaces 16d of the light guide plate 16. In other words, the guide plate contact portions 232 in pair are arranged on the short sides of the light guide plate 16 so as to face each other, and sandwich the light guide plate 16 from the short sides.

As illustrated in FIG. 8, each flexible board 111 is arranged on the end portion of the liquid crystal panel 11 and an end (the printed circuit board 113) of each flexible board 111 is bent toward the back side of the liquid crystal panel 11. The printed circuit board 113g that is connected to an end of the flexible board 111 is fitted in the groove 13c1 of the housing portion 13c. The spacer 30 is arranged between the printed circuit board 113 and the short sidewall portion 13b2 to keep the printed circuit board 113 steady in the groove 13c1 of the printed circuit board 113. The printed circuit board 113 is not completely fixed to the housing portion 13c (e.g. the inside wall portion 13c3). The printed circuit board 113 is pressed against the inside wall portion 13c3 by the elasticity of the spacer 30. However, the printed circuit boards 111 can move to a certain extent so that stress is less likely to be concentrated at connections between the flexible boards 111 and the printed circuit boards 113. After the printed circuit board 113 is inserted in the housing portion 13c, the spacer 30 is inserted in the space between the printed circuit board 113 and the housing portion 13c.

During insertion of the printed circuit board 113 into the groove 13c1 of the housing portion 13c, the printed circuit board 113 is first passed through a space between the guide plate holding portion 231 and the inside wall portion 13c3. The printed circuit board 113 is inserted to the groove 13c1 from one end (a long-side end that is not connected to the flexible boards 111) of the printed circuit board 113. Following the one end of the printed circuit board 113, the other end of the printed circuit board 113 (another long-side end portion that is connected to the flexible boards 111) is passed through the space between the guide plate holding portion 231 and the inside wall portion 13c3. When the other end portion of the printed circuit board 113 is in the space, a part of the printed circuit board 113 is in the groove 13c1. Therefore, a movable range of the printed circuit board 113 is limited. However, as described earlier, since the guide plate holding portion 231 includes the chamfer 231a, the printed circuit board 113 (especially the other end thereof) is easily passed through the space between the guide plate holding portion 231 and the inside wall portion 13c3.

As illustrated in FIG. 5, one of the short-side portions (hereinafter referred to as a non-housing portion) of the frame 13 does not include the printed circuit boards 113. However, the non-housing portion has a similar configuration to a portion that holds the printed circuit boards 113. The non-housing portion does not include a groove for holding the printed circuit board 113 therein. The non-housing portion includes a contact portion 130c that is in contact with the chassis 14. The contact portion 130c has the same outer shape as the housing portion 13c.

The chassis 14 is a plate-like member having a landscape rectangular shape as a whole, which has a similar configuration to the liquid crystal panel 11. The chassis 14 is arranged on the rear side of the liquid crystal display unit LDU (the liquid crystal display device 10) so as to cover the rear plate surface 16c of the light guide plate 16 from the rear side. The chassis 14 includes a chassis body 14a, long-side bottom portions 14b, and short-side bottom portions 14c. The chassis body 14a has a rectangular plate-like shape. The long-side bottom portions 14b extend along long ends of the chassis body 14a. The short-side bottom portions 14c extend along short ends of the chassis body 14a. The chassis body 14a is arranged on the rear plate surface 16c of the light guide plate 16 with the reflection sheet 20 in between. The chassis body 14a constitutes a large part of the chassis 14. The chassis body 14a is in close-contact with the rear plate surface 16c of the light guide plate 16 with the reflection sheet 20 in between.

Each long-side bottom portion 14b has a convex shape that protrudes from the chassis body 14a toward a rear side of the chassis body 14a. The long-side bottom portion 14b has a shallow tray shape along a long-side direction of the chassis 14. As illustrated in FIG. 4, the LED units LU that are fixed to the screw attachment portions 21 of the frame 13 are arranged in a groove-like space provided in the long-side bottom portion 14b.

As illustrated in FIG. 5, each of the short-side bottom portions 14c has a convex shape that protrudes from the chassis body 14a toward the rear side of the chassis body 14a. The short-side bottom portion 14c has a downward-step shape that descends from the chassis body 14a in a front view. The short-side bottom portion 14c has a plate-like shape extending along a short-side direction of the chassis body 14a. A part of the short-side bottom portion 14c adjacent to the chassis body 14a extends toward the front side.

Each long end of the chassis 14 (the long-side bottom portion 14b) includes two kinds of through holes: larger through holes 25A and smaller through holes 25B. Each of the larger through holes 25A is formed so as to cover an end portion (a head portion) of the screw member SM that is used to fix the heat dissipation members 19 to the respective screw attachment portions 21. The through hole 25A is larger than the end portion (the head portion) of the screw member SM. On the other hand, each of the smaller through hole 25B is formed for the screw member SM that is used to fix the chassis 14 to the frame 13. The screw member SM is inserted in the corresponding through hole 25B and the corresponding through hole 19b1 of the heat dissipation member 19 (the heat dissipation portion 19b), and then screwed into the groove 21a. Thus, the chassis 14 is fixed to the chassis 13. Accordingly, the layered component, which includes the liquid crystal panel 11, the optical members 15, the light guide plate 16, and the reflection sheet 20, and the LED units LU that are arranged around the periphery of the layered component are held between the frame 13 and the chassis 14.

Short ends (the short-side bottom portion 14c) of the chassis 14 have through holes 25C. The housing portions 13c of the frame 13 include screw holes 13d. The screw members SM1 are passed through the through holes 25C and the screw holes 13d, and then screwed into the screw holes 13d of the frame 13. Thus, the chassis 14 is fixed to the frame 13 on the short-sides. The receiving portion 13c2 of the housing portion 13c of the frame 13 is in close-contact with a flat part of the short-side bottom portion 14c. A distal end surface of the inside wall portion 13c3 is located at the same level (on the same plane) as the plate surface of the chassis body 14a. The rear plate surface 16c of the light guide plate 16 is attached to the chassis body 14a with the reflection sheet 20 in between. Each of the short-side end portions of the light guide plate 16 is sandwiched between the guide plate portions 231 and the chassis body 14a. Each of the long-side end portions of the light guide plate 16 is sandwiched between the guide plate portions 23 and the chassis body 14a.

The components of the liquid crystal display device 10 (the liquid crystal display unit LDU) are assembled according to the following procedures. First, the frame 13 is set on a workbench. The frame 13 is on the workbench with the front surface of the frame 13 face down (a workbench side) and the rear surface of the frame 13 face up. The liquid crystal panel 11 is attached to an upper side (the rear surface of the frame 13) of the frame 13 on the workbench. Specifically, the liquid crystal panel 11 is placed on the frame 13 with the CF substrate 11a face down (the workbench side) and the array substrate 11b face up. The printed circuit board 11 on the gate side that is connected to the flexible board 11 is inserted in the housing portion 13c of the frame 13. The optical members 15 are placed on the rear surface (the array substrate 11) of the liquid crystal panel 11.

Next, the LED units LU are placed on the screw attachment portions 21 with the LED attachment portions 19a face up and the heat dissipation portions 19b face down. The LED units LU are fixed to the screw attachment portion 21 with the screw members SM. Next, the light guide plate 16 is placed on the optical members 15 with the front plate surface 16a of the light guide plate 16 face down and the rear plate surface 16c of the light guide plate 16 face up. The light guide plate 16 is placed on the frame 13 with a peripheral portion of the front plate surface 16a being in contact with the guide plate holding portions 23, 231 of the frame 13. The light guide plate 16 is positioned with respect to the frame 13 such that a gap (a distance) between each of the end surfaces (the light entrance surfaces) 16b and the corresponding LED unit LU is equal to a predetermined distance.

Next, the reflection sheet 20 is attached on the rear plate surface 16c of the light guide plate 16. Next, the chassis 14 is attached to the frame 13 with the chassis 14 placed on the rear plate surface 16c of the light guide plate 16 with the reflection sheet 21 in between. As described earlier, the chassis 14 is fixed to the screw attachment portion 21 and screw holes 13d of the frame 13 with the screw members SM, SM1. Thus, components of the liquid crystal display unit LDU are assembled.

The stand fitting members STA and the boards PWB, MB, and CTB are attached to the rear side of the liquid crystal display unit LDU, and the stand ST and the cover CV are attached to the liquid crystal display unit LDU. Thus, the liquid crystal display device 10 and the television device TV are produced.

When the liquid crystal display device 10 is turned on and power is supplied from the power source board PWB, signals are sent from the control board CTB to the liquid crystal panel 11 and operation of the liquid crystal panel 11 is controlled. Furthermore, the LEDs 17 included in the backlight device 12 are driven. When the LEDs 17 are driven, light is emitted by the LEDs 17. The light enters the light guide plate 16 through the light entrance surface 16b. The incident light is reflected by the reflection sheet 20 that is laid on the rear side of the light guide plate 16. The light passes through the light guide plate 16 and exits the light guide plate 16 through the front plate surface (the light exit surface) 16a toward the optical members 15. The light from the optical members 15 is formed into planar light that spreads out at a substantially even distribution when the light exits from the optical members 15. The planar light reaches the rear surface of the liquid crystal panel 11. The liquid crystal panel 11 displays images on the display surface 11c (the display area 11c1) using the planer light.

As described above, the liquid crystal display device (the display device) 10 according to this embodiment includes the liquid crystal panel (the display panel) 11, the printed circuit board (the drive board) 113 on the gate side, the flexible board (the flexible wiring) 111, and the frame 13. The liquid crystal panel 11 is configured to display an image on the front side. The flexible board on the gate side is configured to adjust the display driving of the liquid crystal panel (the display panel) 11. The flexible wiring electrically connect the liquid crystal panel (the display panel) 11 and the printed circuit board (the drive board) 113. The flexible wiring has flexibility. The frame 13 includes the frame portion 13a (the short frame portion 13a2), the sidewall 13b (the short sidewall portion 13b2), and the housing portion 13c. The frame portion 13a has the frame-like shape and is arranged opposite the peripheral portion of the front side of the liquid crystal pane 11. The sidewall 13b extends from the frame portion 13a toward the rear side of the liquid crystal panel (the display panel) 11 and surrounds the liquid crystal panel (the display panel) 11. The housing portion 13c is located on the inner side with respect to the sidewall 13b and includes the groove 13c1 that opens to the frame portion 13a. The housing portion 13c holds the printed circuit board (the drive board) 113 that is fitted in the groove 13c1.

In the liquid crystal display device 10 according to this embodiment, the frame 13 includes the sidewall 13b that extends to the rear side of the liquid crystal panel. The housing portion 13c is located inside the sidewall 13b. The housing portion 13c includes the groove 13c1 that opens to the frame portion 13a. Each of the printed circuit boards 113 is fitted in the groove 13c1 and held in the housing portion 13c. In the liquid crystal display device 10, only by inserting the printed circuit board 113 into the groove 13c1, the printed circuit board 113 can be arranged on the rear side of the liquid crystal panel 11 and can be held in the housing portion 13c1. With this configuration, the liquid crystal display device 10 can house the printed circuit board 113 without increasing in size of a frame area of the frame 13, that is, without affecting a reduction in size of the frame.

The printed circuit board 113 that is held in the housing portion 13c is not fully-fixed so that the printed circuit board 113 moves to a certain extent. Therefore, even if vibrations are applied to the liquid crystal display device 10, stresses are less likely to be concentrated at a connection between the printed circuit board 113 and the flexible board 111 and a connection between the flexible board 111 and the liquid crystal panel 11. Accordingly, disconnection (i.e. System on Film (SOF) disconnection) is less likely to occur at each connection.

In this embodiment, only by inserting of the printed circuit boards 113 into the groove 13c1, the printed circuit board 113 can be held in the predetermined housing portion 13c. Therefore, the liquid crystal panel 11 can be easily attached to the frame 13. This may result in high productivity of the liquid crystal display device 10.

The configuration of the liquid crystal display device 10 of this embodiment is suitable, in particular, for a liquid crystal display device that includes a large liquid crystal panel 11 (including the printed circuit board 113 on the gate side).

In the liquid crystal display device 10 according to this embodiment, the housing portion 13c holds the printed circuit boards 113 in a standing position with respect to the liquid crystal panel 11. With this configuration in which the housing portion 13c holds the printed circuit boards 113 in a standup position with respect to the liquid crystal panel 11, the size of the groove 13c1 (a width in the X-axis direction) of the housing portion 13c can be set smaller. Accordingly, the width of the frame portion 13a (the frame 13) can be set to smaller.

In the liquid crystal display device 10 according to this embodiment, the housing portion 13c continues from the sidewall 13b (the short sidewall portion 13b1). Therefore, the housing portion 13c and the sidewall 13b (the short sidewall portion 13b1) are made of the same material and have no joints. With this configuration in which the housing portion 13c continues from the sidewall 13b (he short sidewall portion 13b1), the number of parts or the number of assembly steps of the liquid crystal display device 10 can be reduced.

The liquid crystal display device 10 according to this embodiment includes the spacer 30 between the housing portion 13c and the printed circuit boards 113. As described earlier, the spacer 30 is an elastic body. By arranging the spacer 30 between the housing portion 13c and the printed circuit board 113, the printed circuit board 113 may be held steady. Further, by using the spacer 30, the printed circuit board 30 in the standing position can be property maintained in the housing portion 13c with respect to the liquid crystal panel 11.

In the liquid crystal display device 10 according to this embodiment, the frame portion 13a (the short frame portion 13a2) of the frame 13 includes the guide plate holding portion 231 as the guide plate contact portion. The guide plate holding portion 231 is in contact with the peripheral area of the front plate surface (the light exit surface) 16a of the light guide plate 16. The guide plate holding portion 231 holds the light guide plate 16 between the guide plate holding portion 231 and the chassis body 14a of the chassis 14. The guide plate holding portion 231 is opposite the housing portion 13c of the frame 13 and includes the chamfer 231a on the sidewall 13b side. The guide plate holding portion 231 is opposite the housing portion 13a and includes the chamfer 231a. Therefore, when the printed circuit board 113 is inserted into the groove 13c1 of the housing portion 13c, the printed circuit board 113 is less likely to be stuck by a part of the guide plate holding portion 231 on the sidewall 13b side. Therefore, the printed circuit board 113 is less likely to be obstructed during installation.

In the liquid crystal display device 10 according to this embodiment, the multiple guide plate holding portions 231 as the guide plate contact portions are arranged at intervals along the peripheral area of the front plate surface (the light exit surface) 16a of the light guide plate (see FIG. 7). Between the adjacent guide plate holding portions (the guide plate contact portions) 231, the cutouts (the wiring paths) 240 are provided through which the respective flexible boards (the flexible wirings) 111 are passed. With the cutouts (the wiring paths) 240, the flexible boards 111 are less likely to come into contact with the guide plate holding portion 231 and less likely to cause unexpected changes in shape. Further, the cutouts (the wiring paths) 240 can properly lead the printed circuit boards 113 into the groove 13c1.

<Second Embodiment>

Figure 9:
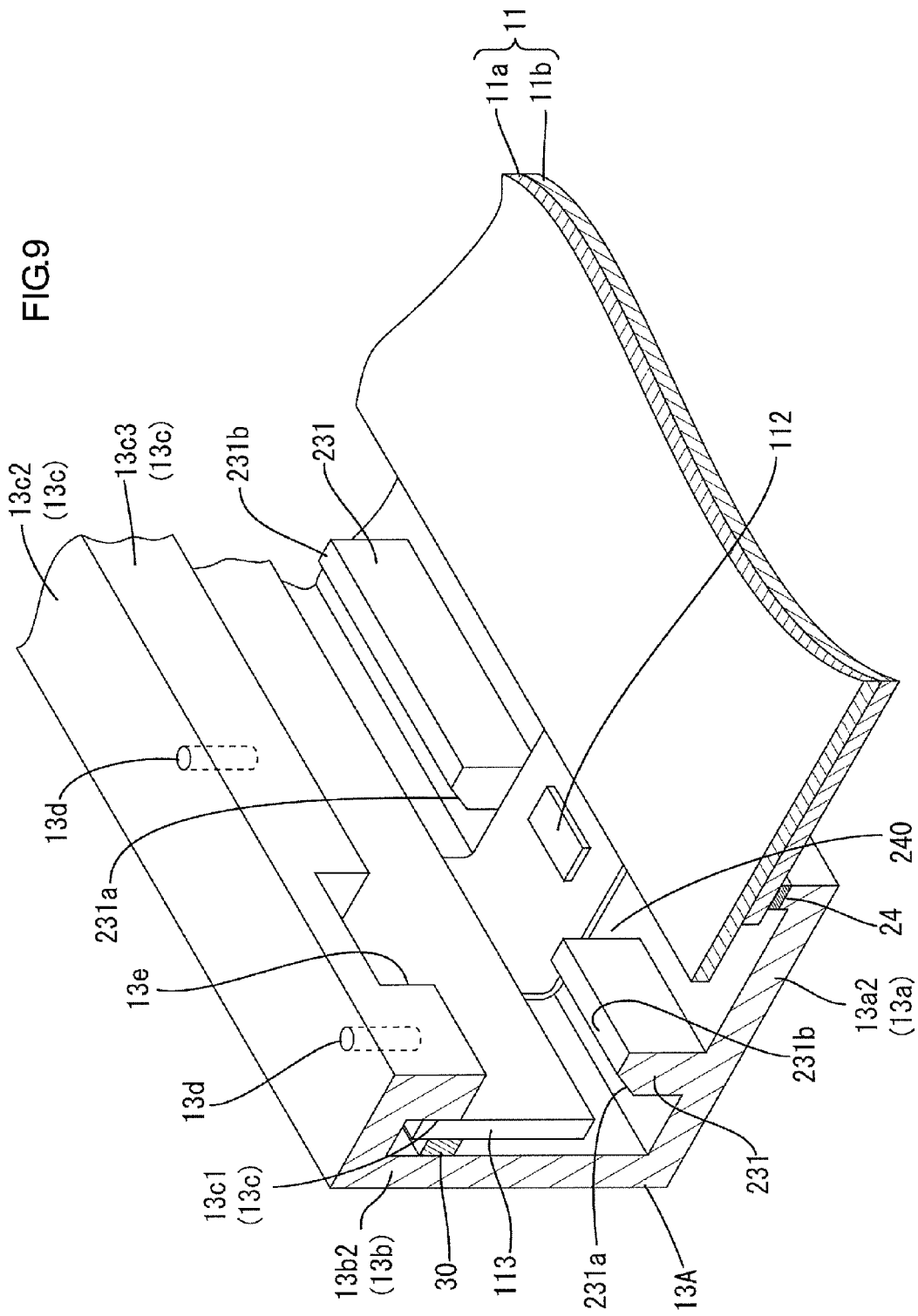
FIG. 9 is a perspective view of the back side of the frame, illustrating a part of a housing portion included in a frame according to a second embodiment.

A second embodiment of this invention will be described with reference to FIG. 9. The same components will be indicated by the same symbols as the first embodiment and will not be described. A basic configuration of a liquid crystal display device (not illustrated) according to this embodiment is similar to one in the first embodiment. A configuration of a frame 13A of this embodiment differs from a configuration of the frame of the first embodiment. Specifically, the frame 13A further includes a void 13e, which is not included in the frame 13 of the first embodiment. FIG. 9 is a perspective view of a back side of the frame 13A illustrating a part of a housing portion 13C included in the frame 13A according to the second embodiment. As illustrated in FIG. 9, the inside wall portion 13c3 of the housing portion 13c of the frame 13A has the void 13e. The void 13e is located at an extended end portion on a frame portion 13a side. The void 13e is formed by cutting out a part of the extended end portion. A part of the printed circuit board 113 is visible through the void 13e. During disassembly of the liquid crystal display device, a worker may involve a removal of the printed circuit board 113 from the housing portion 13c. Because the inside wall portion 13c3 has the void 13e, the worker can access the printed circuit board 113 through the void 13e of the inside wall portion 13c3. Therefore, the worker can easily remove the printed circuit board 113 from the housing portion 13c. The void 13e may be formed such that an end portion (one of long-side end portions that is not connected to the flexible board 111) of the printed circuit board 113 is uncovered. With this configuration, an inclination of the printed circuit board 113 in the housing portion 13c can be checked through the void 13e. Namely, because the end portion of the printed circuit boards is designed to have a straight edge and an inclination of the end portion can be checked through the void 13e, the inclination of the printed circuit board 113 in the housing portion 13c can be estimated from the inclination of the end portion.

In the liquid crystal display device according to this embodiment, the void 13e is located opposite the cutout 240 (the wiring path) in the frame portion 13a. In this configuration including the void 13e located opposite the cutout 240 (the wiring path), a larger space (a gap) is provided between the housing portion 13c and the frame portion 13a, especially, in an area around the void 13e. Therefore, a worker can easily attach the printed circuit board 113 to the housing portion 13c or detach the printed circuit board 113 from the housing portion 13c.

<Third Embodiment>

Figure 10:
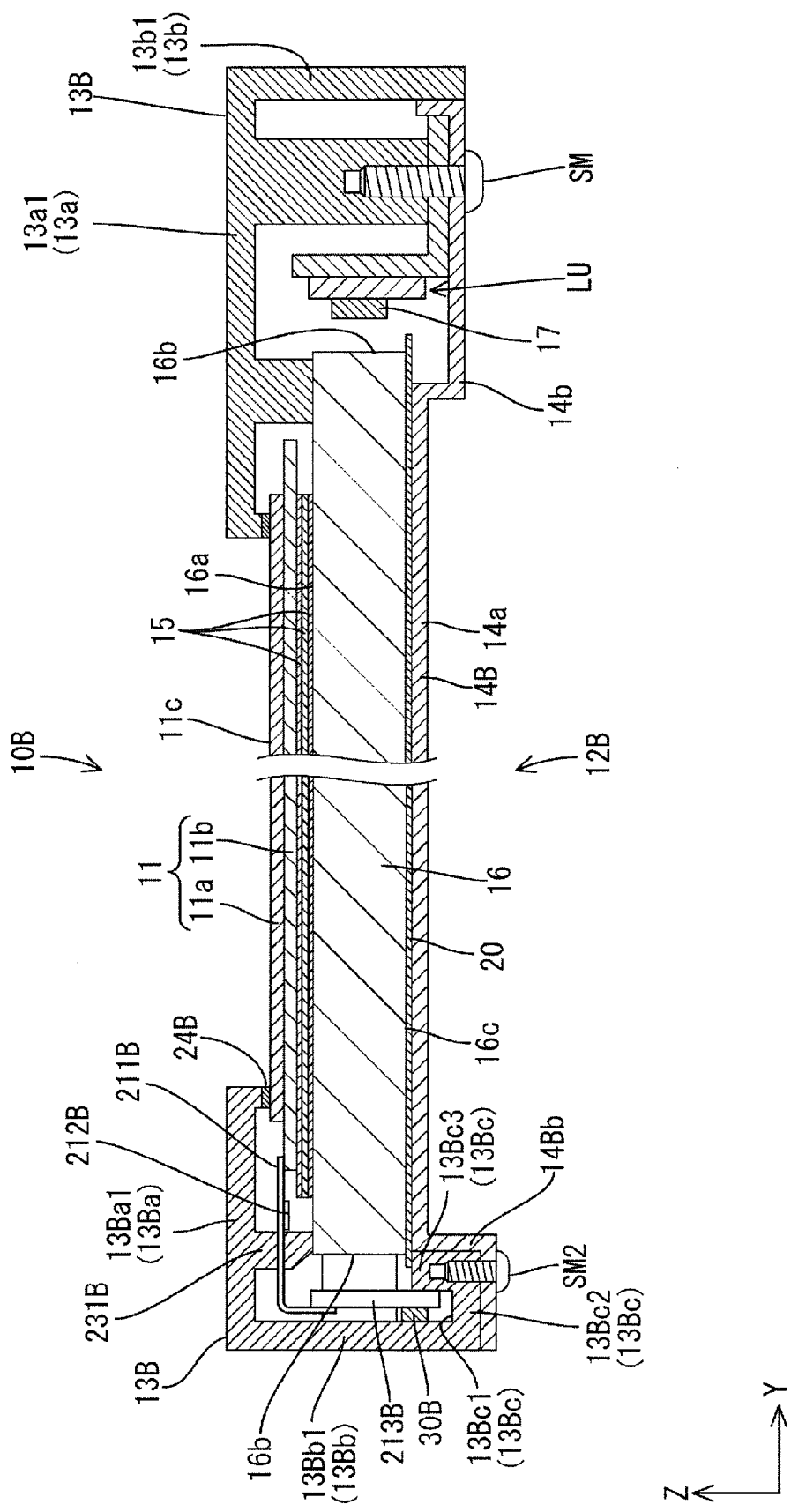
FIG. 10 is a cross-sectional view of a liquid crystal display device according to a third embodiment.

A third embodiment of this invention will be described with reference to FIG. 10. FIG. 10 is a cross-sectional view of a liquid crystal display device 10B of the third embodiment. The liquid crystal display device 10B has a rectangular shape similar to one in the first embodiment. FIG. 10 illustrates a cross-sectional configuration of the liquid crystal display device 10B taken along a short-side direction thereof. The liquid crystal display device 10B includes two long-side portions. The LED units LU are arranged in one of the long-side portions. As illustrated in FIG. 10, one of the long-side end surfaces 16b (the end surface 16b on the right side in FIG. 10) of the light guide plate 16 is opposite the LEDs 17 of the LED units LU. The other one of the long-side surfaces 16b (the end surface 16b on the left side in FIG. 10) is opposite printed circuit boards 213B on the source side included in the liquid crystal panel 11. In other words, the printed circuit boards on the source side in addition to the printed circuit boards on the gate side are inserted and held in housing portions of a frame. The printed circuit boards on the gate side are held by a short-side portion of a frame 13B that has a similar configuration to one in the first embodiment.

A basic configuration of the liquid crystal panel 11 used in this embodiment is similar to one used in the first embodiment. Multiple flexible boards 211B are arranged at predetermined intervals along one of long-side end portions of the liquid crystal panel 11. Each flexible board 211B has a longer length (a length in the Y-axis direction) than one in the first embodiment. Printed circuit boards 213B having similar configurations to ones in the first embodiment are connected to the respective flexible boards 211B. Drivers 212B having similar configurations to ones in the first embodiment are mounted on the respective flexible boards 211B.

The frame 13B has a substantially rectangular shape, similar to one in the first embodiment, and includes a frame portion 13Ba and a sidewall 13Bb. Configurations of two long-side portions of the frame 13B are different from each other. One of the long-side portions in which printed circuit boards 213B are arranged has a basic configuration similar to that of the short side of the frame 13 of the first embodiment. The other one of the long-side portions in which LED units LU are arranged has the same configuration as the long side of the frame 13 of the first embodiment. A configuration of the frame 13, especially, a configuration of the long-side portion in which the printed circuit board 213B is arranged will be described.

As illustrated in FIG. 10, one of the long-side portions of the frame 13 includes a long frame portion 13Ba1 , a long sidewall portion 13Bb1, and a housing portion 13Bc. The long frame portion 13Ba1 has a plate-like shape. The long sidewall portion 13Bb1 extends from an outer end of the long frame portion 13Ba1 toward a rear side (the lower side in FIG. 10). The housing portion 13Bc for holding the printed circuit boards 231B is arranged inside the long sidewall portion 13Bb1. The housing portion 13Bc includes a receiving portion 13Bc2 and an inside wall portion 13Bc3. The receiving portion 13Bc2 has a plate-like shape that extends from the long sidewall portion 13Bb1 toward the liquid crystal panel 11. The inside wall portion 13Bc3 extends from the receiving portion 13Bc2 toward the frame portion 13Ba (the long frame portion 13Ba1 ) with a predetermined space away from the long sidewall portion 13Bb1. The housing portion 13Bc further includes a groove 13Bc1 that is defined by the sidewall 13Bb (the long sidewall portion 13Bb1), the receiving portion 13Bc2, and the inside wall portion 13Bc3. The printed circuit boards 213B on the source side are arranged in the groove 13Bc1 of the housing portion 13Bc and held in the housing portion 13Bc with the same principle as the printed circuit board on the gate side (see the first embodiment). A spacer 30B made of an elastic material is arranged in the housing portion 13Bc. The spacer 30B presses the printed circuit boards 213B toward the inside wall portion 13Bc3 of the housing portion 13bc. The printed circuit board 213B stays steady inside the housing portion 13Bc such that surfaces of the printed circuit board 213B are in a standing position with respect to the plate surface 11c of the liquid crystal panel 11. A chassis 14B includes two long-side bottom portions, that is, a long-side bottom portion 14Bb and a long-side bottom portion 14b. A shape of the long-side bottom. portion 14Bb is smaller in size than that of the long-side bottom portion 14b corresponding to a shape of the housing portion 13Bc of the frame 13. The long-side bottom portion 14Bb and the housing portion 13Bc of the frame 13 are fixed to each other by screwing screw members SM2 into the housing portion 13Bc.

External wirings (e.g. wirings including flexible printed circuit boards) are connected to the printed circuit boards 213B on the source side held in the housing portion 13Bc. Therefore, the inside wall portion 13Bc3 and the receiving portion 13Bc2 that are included in the housing portion 13Bc have through holes (cutouts) through which the wirings are passed.

In the liquid crystal display device 10B according to this embodiment, not only the printed circuit boards on the gate side but also the printed circuit boards 213B on the source side are arranged in the housing portions 13Bc of the frame 13B. As just described, the printed circuit boards 213B on the source side may be arranged in the housing portion 13Bc of the frame 13B. The light guide plate 16 of this embodiment includes end surfaces 16b and 16d along a periphery thereof. Among the end surfaces 16b and 16d, an end surface that is not opposite the light sources (the LED units LU) may face drive boards 213B that include the printed circuit boards (source board) 213B on the source side and the printed circuit boards (gate boards) 113 on the gate side (see the first embodiment). In such a case, it is suitable to arrange the drive boards 213B in the predetermined housing portions 13Bc of the frame 13B. By arranging the drive boards including the printed circuit boards in the housing portions, a size of the long side portion of the liquid crystal display device 10B where the printed circuit boards 213B on the source side can be reduced.

<Other Embodiments>

The scope of the invention is not limited to the above embodiments described in the above description and the drawings. The following embodiments are also included in the technical scope of this invention, for example.

(1) In the above first embodiment, only the printed boards on the gate side are arranged in the housing portion of the frame. In the above third embodiment, the printed circuit boards on the gate side and the source circuit boards are arranged in the housing portions of the frame. In other embodiments, only the printed circuit board on the source side may be arranged in the housing portion of the frame as appropriate.

(2) In the above first embodiment, the printed circuit board is arranged in the housing portion in a standing position with respect to the liquid crystal panel. In other embodiments, the printed circuit board may be arranged in the housing portion with the plate surfaces of the printed circuit board slightly inclined, as long as the inclination does not affect a reduction in size of the frame of the liquid crystal display device. In the above configuration, the spacer made of an elastic material may not be arranged in the housing portion.

(3) In the above first embodiment, the housing portion for holding the printed circuit board continues from the frame (the sidewall portion). In other embodiments, the housing portion and the sidewall portion may be prepared as different components and may be attached (connected) to each other. Further, materials of the housing portion and the sidewall portion may be different. However, the most suitable configuration in view of a reduction in number of components is the configuration of the first embodiment in which the housing portion continues from the sidewall portion.

(4) In the above first embodiment, the end portion of the guide plate housing portion (the guide plate contact portion) includes the chamfer as the inclined surface. In other embodiments, the end portion of the guide plate holding portion (the guide plate contact portion) may not include chamfer.

(5) In the above embodiments, this invention is applied to an edge-light type (a sidelight type backlight device) backlight device. However, this invention may be applied to a direct-type backlight device.

(6) In the above embodiments, the LEDs are used as the light sources. However, light sources other than LEDs may be used in other embodiments.

(7) In other embodiments, the number or the arrangement of the LED boards or the number or the arrangement of LEDs may be altered as appropriate.

(8) In the above embodiments, the liquid crystal panel and the chassis are arranged in a vertical position such that the respective short-side directions correspond to the vertical direction. However, the liquid crystal panel and the chassis may be arranged in a vertical position such that the respective long-side directions correspond to the vertical direction in other embodiments.

(9) In the above embodiments, the TFTs are used as switching components of the liquid crystal display device. However, this invention can be applied to liquid crystal display devices including switching components other than TFTs (e.g., thin film diodes (TFDs)). Further, this invention can be applied not only color liquid crystal display devices but also black-and-white liquid crystal display devices.

(10) In the above embodiments, the liquid crystal display device including the liquid crystal panel as a display panel is used. However, this invention can be applied to display devices including other types of display panels.

(11) In the above embodiments, the television device including a tuner is described. However, this invention can be applied to display devices without tuners.

EXPLANATION OF SYMBOLS

10: liquid crystal display device (display device), 11: liquid crystal panel (display panel), 12: backlight device (lighting device), 13: frame, 13*a*: frame portion, 13*b*: sidewall, 13*c*: housing portion, 13*c*1: groove, 13*c*2: receiving portion, 13*c*3: inside wall portion, 14: chassis, 15: optical members, 16: light guide plate, 17: LED (light source), 18: LED board (light source board), 19: heat dissipation member, 20: reflection sheet, 111: flexible board on the gate side (flexible wiring), 112: gate driver, 113: printed circuit board on the gate side (gate board, drive board), TV: television device.

The invention claimed is:

1. A display device, comprising:
    a display panel configured to display an image on a front side thereof;
    a drive board configured to adjust display driving of the display panel;
    a flexible wiring having flexibility and establishing electrical connection between the display panel and the drive board; and
    a frame including:
        a frame portion arranged opposite a peripheral area of the front side of the display panel;
        a sidewall extending from the frame portion toward a rear side of the display panel and surrounding the display panel, the sidewall including an interior surface and an exterior surface; and
        a housing portion that includes a groove, the housing portion and the groove being located inward of the interior surface of the sidewall, the housing portion holding the drive board fitted in the groove thereof.

2. The display device according to claim 1,
wherein the housing portion further includes:
    a receiving portion extending from the sidewall toward the display panel; and
    an inside wall portion extending from the receiving portion toward the frame portion with a predetermined space away from the sidewall, and
wherein the groove is defined by the sidewall, the receiving portion and the inside wall portion.

3. The display device according to claim 1, wherein the housing portion holds the drive board in a standing position with respect to the display panel.

4. The display device according to claim 2,
wherein the inside wall portion includes a void at an extended end portion thereof on a frame portion side, the void being a cutout formed at a part of the extended end portion and through which a part of the drive board held in the housing portion is visible.

5. The display device according to claim 1, wherein the housing portion continues from the sidewall.

6. The display device according to claim 1, further comprising a spacer arranged between the housing portion and the drive board.

7. The display device according to claim 1, further comprising a lighting device arranged on a rear side of the display panel and configured to emit light toward a rear surface of the display panel,
    wherein the display panel is configured to display the image on the front side using the light reaching the rear surface of the display panel.

8. The display device according to claim 7,
wherein the lighting device includes:
    a light source;
    a light guide plate including:
        at least one light entrance surface being at least one end surface of the light guide plate, the at least one light entrance surface through which light enters; and
        a light exit surface being a front plate surface of the light guide plate, the light exit surface through which the light in the light guide plate from the light entrance surface exits toward the rear surface of the display panel,
wherein the frame includes a light guide plate contact portion that is in contact with the light guide plate and holding the light guide plate.

9. The display device according to claim 8, further comprising a chassis arranged opposite a rear plate surface of the light guide plate, the chassis holding the display panel and the light guide plate between the chassis and the frame.

10. The display device according to claim 9,
wherein the frame portion includes the light guide plate contact portion, the light guide plate contact portion being in contact with a peripheral area of the light exit surface, and
wherein the light guide plate contact portion holds the light guide plate between the light guide plate contact portion and the chassis.

11. The display device according to claim 8,
wherein the light guide plate contact portion is opposite the housing portion and includes a chamfer on a portion side.

12. The display device according to claim 8,
wherein the light guide plate contact portion includes a plurality of light guide plate contact portions arranged at an interval along the peripheral area of the light exit surface, and
wherein a wiring path is provided between the light guide plate contact portions adjacent to each other, the wiring path in which the flexible wiring is arranged.

13. The display device according to claim 12,
wherein the housing portion further includes:
    a receiving portion extending from the sidewall toward the display panel; and
    an inside wall portion extending from the receiving portion toward the frame portion with a predetermined space away from the sidewall,
wherein the groove is defined by the sidewall, the receiving portion and the inside wall portion,
wherein the inside wall portion includes a void at an extended end portion thereof on a frame portion side, the void being a cutout formed at a part of the extended end portion and through which a part of the drive board held in the housing portion is visible, and
wherein the void is provided in a position opposite the wiring path.

14. The display device according to claim 1, wherein the display panel is a liquid crystal panel including a pair of substrates with liquid crystals sealed therebetween.

15. A television device comprising the display device according to claim 1.

* * * * *